(12) United States Patent
Han et al.

(10) Patent No.: US 8,427,871 B2
(45) Date of Patent: Apr. 23, 2013

(54) NONVOLATILE MEMORY DEVICE, MEMORY SYSTEM INCORPORATING SAME, AND METHOD OF OPERATING SAME

(75) Inventors: Jinman Han, Seongnam-si (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 224 days.

(21) Appl. No.: 12/820,435

(22) Filed: Jun. 22, 2010

(65) Prior Publication Data
US 2011/0051514 A1 Mar. 3, 2011

(30) Foreign Application Priority Data
Aug. 27, 2009 (KR) .................. 10-2009-0079998

(51) Int. Cl.
*G11C 16/06* (2006.01)
(52) U.S. Cl.
USPC ............ 365/185.09; 365/185.22; 365/185.29; 365/185.17; 365/185.18
(58) Field of Classification Search ............. 365/185.09, 365/185.22, 185.29, 185.17, 185.18
See application file for complete search history.

(56) References Cited

U.S. PATENT DOCUMENTS

| 5,920,502 | A | 7/1999 | Noda et al. | |
|---|---|---|---|---|
| 7,304,893 | B1* | 12/2007 | Hemink et al. | 365/185.22 |
| 7,317,636 | B2 | 1/2008 | Ide et al. | |
| 2005/0125708 | A1* | 6/2005 | Simon | 714/6 |
| 2009/0003064 | A1 | 1/2009 | Kim et al. | |
| 2010/0074025 | A1* | 3/2010 | Park et al. | 365/185.22 |

FOREIGN PATENT DOCUMENTS

| JP | 2005353242 A | 12/2005 |
|---|---|---|
| JP | 2006209971 A | 8/2006 |
| KR | 100486132 | 4/2005 |
| KR | 1020060046437 A | 5/2006 |
| KR | 1020080103783 A | 11/2008 |

* cited by examiner

*Primary Examiner* — Toan Le
*Assistant Examiner* — Hai Pham
(74) *Attorney, Agent, or Firm* — Volentine & Whitt, PLLC

(57) ABSTRACT

A nonvolatile memory device performs a program operation comprising applying a program pulse to selected memory cells, detecting a number of fail bits among the selected memory cells, the fail bits comprising failed program bits and disturbed inhibit bits, and determining a program completion status of the program operation based on the number of detected fail bits.

20 Claims, 23 Drawing Sheets

US 8,427,871 B2

NONVOLATILE MEMORY DEVICE, MEMORY SYSTEM INCORPORATING SAME, AND METHOD OF OPERATING SAME

CROSS-REFERENCE TO RELATED APPLICATIONS

This application claims priority under 35 U.S.C. §119 to Korean Patent Application No. 10-2009-0079998 filed on Aug. 27, 2009, the disclosure of which is hereby incorporated by reference in its entirety.

BACKGROUND

Embodiments of the inventive concept relate generally to semiconductor memory devices. More particularly, embodiments of the inventive concept relate to nonvolatile memory devices, systems, and related methods of operation.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power. Because nonvolatile memory devices retain stored data when disconnected from power, they are often used to store data that must be retained even when devices are powered down.

Examples of volatile memory devices include dynamic random access memory (DRAM) and static random access memory (SRAM). Examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are now used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

Flash memory is among the more frequently adopted forms of nonvolatile memory. It can be found in a wide variety of devices, including standalone applications such as memory cards, portable devices such as netbook computers, home electronics such as televisions, and others.

As flash memory continues to be adopted in a variety of devices, there is increasing pressure to improve the integration density of flash memories to provide larger storage capacity. To improve the integration density, however, improvements are needed in various aspects of flash memory design and operation.

SUMMARY

Embodiments of the inventive concept provide nonvolatile memory devices, memory systems incorporating the same, and methods of programming the nonvolatile memory devices.

According to one embodiment of the inventive concept, a method of performing a program operation in a nonvolatile memory device comprises applying a program pulse to selected memory cells, detecting a number of fail bits among the selected memory cells, the fail bits comprising failed program bits and disturbed inhibit bits, and determining a program completion status of the program operation based on the number of detected fail bits.

In certain embodiments, the number of failed program bits and disturbed program bits are detected simultaneously.

In certain embodiments, multiple program loops are performed until the detected number of failed bits falls below a predetermined reference value.

In certain embodiments, multiple program loops are performed until a detected number of fail bits in a current program loop increases relative to a detected number of fail bits in a previous program loop.

In certain embodiments, the program operation is completed upon determining that the number of detected fail bits is less than or equal to a reference value.

In certain embodiments, the reference value changes according to a number of program or erase operations that have been performed previously on a memory block containing the selected memory cells. In certain embodiments, the reference value decreases as the number of program or erase operations increases. In certain embodiments, the reference value corresponds to a number of bits that can be corrected through the use of an error correction code.

In certain embodiments, multiple program loops are performed, and the program operation is designated as a failure upon determining that a predetermined number of program loops have been performed and the number of fail bits remains above another predetermined value.

In certain embodiments, the nonvolatile memory device is a flash memory device. In certain embodiments, the nonvolatile memory device is a multi-level cell flash memory device.

In certain embodiments, fail bits are detected in each of a plurality of sectors of the selected memory cells, and the program completion status is determined based on a number of fail bits in each of the sectors.

According to another embodiment of the inventive concept, a nonvolatile memory device comprises a page buffer circuit configured to store program bits and inhibit bits to be programmed in selected memory cells in a program operation, and further configured to perform a program verify operation to detect failed program bits and disturbed inhibit bits from the selected memory cells, and control logic configured to determine a completion state of the program operation based on the number of detected failed program bits and disturbed inhibit bits.

In certain embodiments, the page buffer circuit comprises a plurality of page buffers, and each of the plurality of page buffers comprises an inhibit data latch for storing inhibit bit data, and a sense latch for storing data indicating a program state of a corresponding one of the selected memory cells, wherein each of the plurality of page buffers is configured to compare the stored inhibit bit data with the data stored in the sense latch to determine a program status of the corresponding one of the selected memory cells.

In certain embodiments, the sense latch is configured to store a fail bit to indicate whether the corresponding one of the selected memory cells has been successfully programmed, and to output a fail bit upon determining that the corresponding one of the selected memory cells has not been successfully programmed, and each of the plurality of page buffers outputs the fail bit stored in its sense latch in response to a program verify signal during the program verify operation.

In certain embodiments, the selected memory cells are flash memory cells.

According to still another embodiment of the inventive concept, a memory system comprises a nonvolatile memory device, and a memory controller controlling the nonvolatile memory device to perform a program operation comprising applying a program pulse to selected memory cells, detecting a number of failed program bits and disturbed inhibit bits, and determining a program completion status of the program operation based on the detected number of failed program bits and disturbed inhibit bits.

In certain embodiments, the nonvolatile memory device and the memory controller are incorporated in a solid state drive.

In certain embodiments, the memory controller controls the nonvolatile memory device to terminate the program operation upon determining that the detected number of failed program bits and disturbed inhibit bits exceeds a predetermined reference number.

In certain embodiments, the memory system further comprises an error correction code circuit configured to correct the failed program bits and disturbed inhibit bits in a read operation performed subsequent to the program operation.

BRIEF DESCRIPTION OF THE DRAWINGS

Selected embodiments of the inventive concept are described below with reference to the accompanying drawings. In the drawings, like reference numbers denote like features.

DETAILED DESCRIPTION OF THE EMBODIMENTS

Selected embodiments of the inventive concept will now be described with reference to the accompanying drawings. These embodiments are presented as teaching examples and should not be construed to limit the scope of the inventive concept as defined by the claims.

Figure 1:
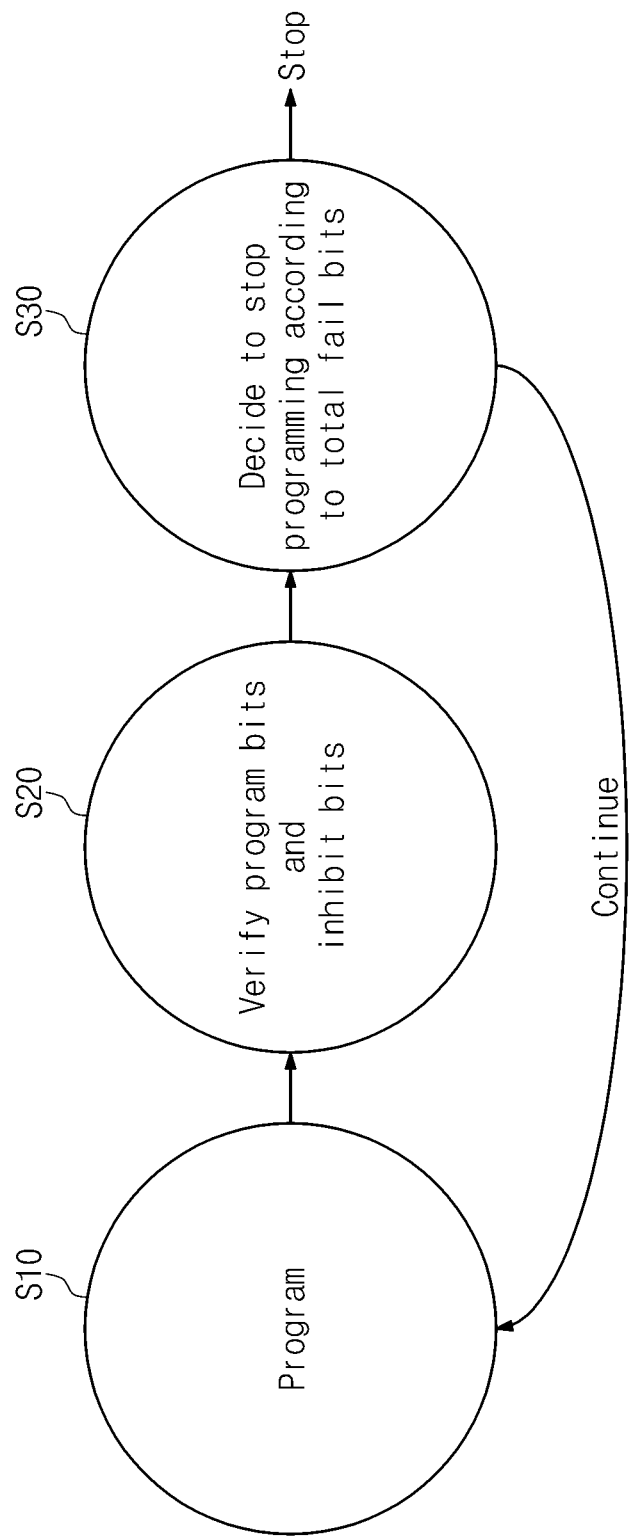
FIG. 1 is a flow diagram illustrating a programming method of a nonvolatile memory device according to an embodiment of the inventive concept.

FIG. 1 is a diagram illustrating a programming method of a nonvolatile memory device according to an embodiment of the inventive concept. In the description that follows, example method steps will be indicated by parentheses (SXX).

Referring to FIG. 1, the nonvolatile memory device performs a program operation based on a set of program bits and inhibit bits received from an external source (S10). The program bits correspond to memory cells to be programmed and the inhibit bits correspond to memory cells to be inhibited from programming. For example, program bits can be assigned to data '0', and inhibit bits can be assigned to data '1'.

After the program operation, the nonvolatile memory device performs a program verify operation on program bits and inhibit bits (S20). The program verify operation on the program bits determines whether the program operation is performed properly and a program verify operation on the inhibit bits determines whether a program inhibit operation has been performed properly. The program operation is deemed to be performed properly where the program bits are successfully programmed in corresponding memory cells. The program inhibit operation is deemed to be performed properly where memory cells corresponding to the inhibit bits remain in the same state.

The program verify operation identifies failed program bits and disturbed inhibit bits. A failed program bit is a program bit that has not been successfully programmed in a corresponding memory cell, and a disturbed inhibit bit is an inhibit bit for which a corresponding memory cell has been erroneously programmed to a different state. Failed program bits and disturbed inhibit bits are both considered to be fail bits.

Program verify operations are typically performed simultaneously on the program bits and inhibit bits. However, the inventive concept is not limited to such simultaneous operations. Rather, the order of program verify operations can be modified in various alternative embodiments.

As a result of the program verify operation, a total number fail bits is obtained. The nonvolatile memory device determines whether to finish or terminate the program operation according to the number of the obtained fail bits (S30). For example, where the number of fail bits is not greater than a predetermined value, program completion, or termination of the program operation, is determined. The predetermined value is typically less than or equal to a number of errors that can be corrected through the use of an error correction code an error correction code.

Where the number of fail bits in a current program loop increases relative to a previous program loop, program completion is determined. Moreover, where program completion is not determined in step S30, the program loop is repeated.

The nonvolatile memory device performs a program verify operation on program bits and inhibit bits during a program operation and determines program completion according to the total number of fail bits based on a result of the program verify operation. By doing this, the nonvolatile memory device can reduce the number of applied program pulses or fail bits during a program operation compared with various conventional techniques.

Figure 2:
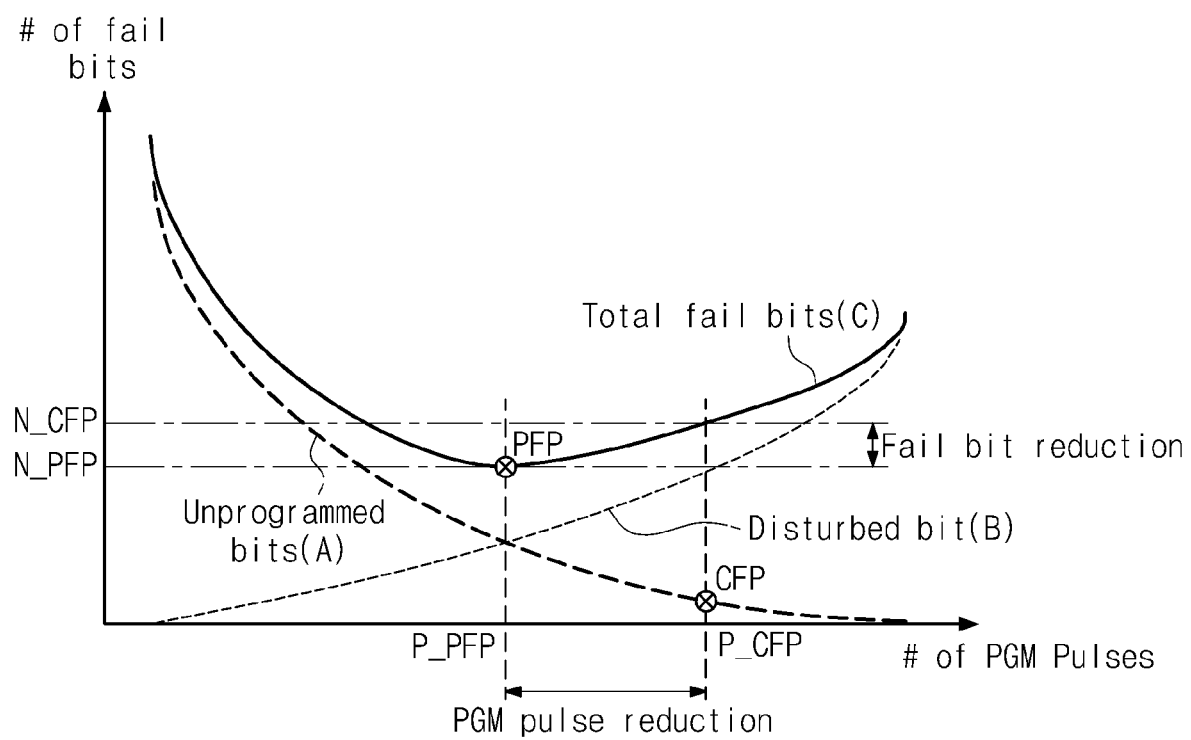
FIG. 2 is a graph illustrating a relationship between a number of program pulses applied to a nonvolatile memory device in a program operation, and a number of fail bits in the nonvolatile memory device.

FIG. 2 is a graph illustrating a relationship between a number of program pulses applied to a nonvolatile memory device in a program operation, and a number of fail bits in the nonvolatile memory device.

Referring to FIG. 2, a curve "A" illustrates a number of failed program bits as a function of an increasing number of program pulses, a curve "B" illustrates a number of disturbed inhibit bits as a function of an increasing number of program pulses, and a curve "C" illustrates a total number of fail bits as a function of an increasing number of program pulses. In this example, the number of failed program bits is obtained from a program verify operation performed on program bits, and the number of disturbed inhibit bits is obtained from a program verify operation performed on inhibit bits.

As indicated by curve "A", the number of failed program bits decreases as the number of program pulses increases. As indicated by curve "B", the number of disturbed inhibit bits tends to increase as the number of program pulses decreases.

In this example, completion of the program operation is determined by a total number of fail bits observed in the program operation. In particular, where the number of fail bits falls below a predetermined number, the program operation is completed.

A conventional nonvolatile memory device finishes a program operation upon determining that the number of non-programmed bits reaches a completion finish point CFP. A nonvolatile memory device according to certain embodiments of the inventive concept, however, finishes a program operation upon determining that a sum of failed program bits and disturbed inhibit bits reaches a predetermined finish point (PFP).

Finish point PFP is determined by a number of fail bits N_PFP with a minimum value as shown in curve "C". Typically, the total number of fail bits N_PFP corresponding to finish point PFP is less than or equal to a maximum number of bits that can be corrected through the use of an error correction code.

Referring to FIG. 2, until the program operation is finished, a number of program pulses P_PFP of a nonvolatile memory device according to an embodiment of the inventive concept is less than a number of program pulses P_CFP of a conventional nonvolatile memory device. Consequently, the nonvolatile memory device can improve reliability of a memory cell more during a program operation compared with the conventional nonvolatile memory device.

Additionally, until the program operation is finished, the total number of fail bits N_PFP of the nonvolatile memory device is less than that N_CFP of a conventional nonvolatile memory device. Therefore, the entire number of error bits to be corrected is reduced. As a result, the overall performance of a memory system including the nonvolatile memory device can be improved.

For convenience of description, it is assumed that the nonvolatile memory device is a NAND flash memory device. However, the inventive concept is not limited to NAND flash memory devices. Rather, the inventive concept can be embodied with other forms of nonvolatile memory, such as NOR flash memory device, resistive random access memory (RRAM), phase-change random access memory (PRAM), magnetroresistive random access memory (MRAM), ferroelectric random access memory (FRAM), and spin transfer torque random access memory (STT-RAM). Additionally, the nonvolatile memory device can be implemented with a three-dimensional array structure.

Additionally, for convenience of description, it is assumed that the nonvolatile memory device performs a program operation using incremental step pulse programming (ISPP) in which a gradually increasing program voltage is applied to programmed memory cells in a number of loops. However, the inventive concept is not limited to ISPP, and can be embodied with other types of programming operations.

Figure 3:
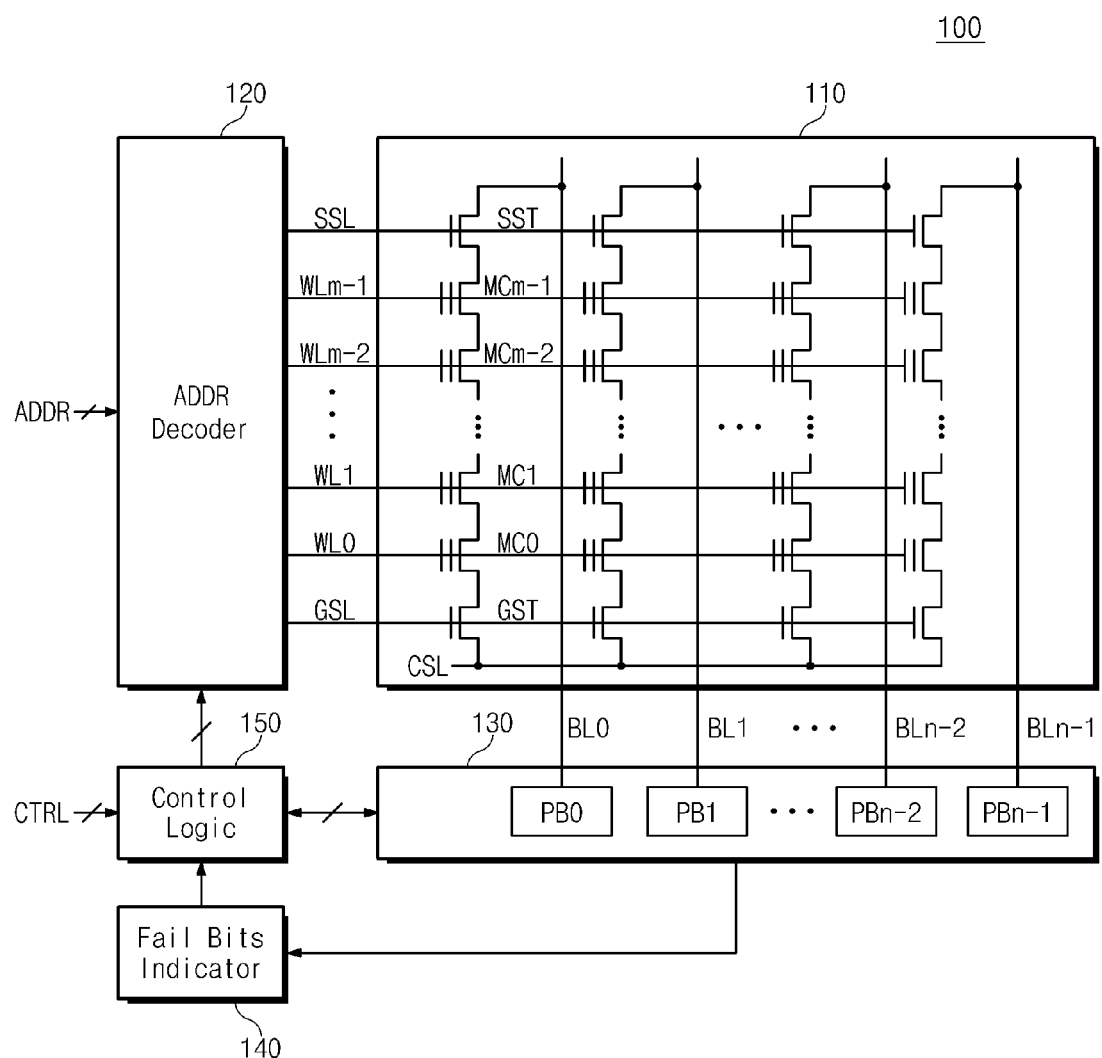
FIG. 3 is a block diagram of a nonvolatile memory device according to an embodiment of the inventive concept.

FIG. 3 is a block diagram of a nonvolatile memory device according to an embodiment of the inventive concept.

Referring to FIG. 3, a nonvolatile memory device 100 comprises a memory cell array 110, an address decoder 120, an input/output circuit 130, a fail bits indicator 140, and control logic 150.

Control logic 150 determines program completion according to the number of fail bits, which includes the number of failed program bits and disturbed inhibit bits.

Memory cell array 110 comprises a plurality of memory cells located at intersections between a plurality of wordlines WL0 through WLm-1 and a plurality of bitlines BL0 through BLn-1. The memory cells in memory cell array 110 are typically arranged in a plurality of memory blocks (not shown). In FIG. 3, a single memory block is illustrated for explanation purposes. Each memory block comprises a plurality of pages, and each page comprises a plurality of memory cells connected to a corresponding wordline. Nonvolatile memory device 100 performs erase operations by block unit, and performs program and read operations by page unit.

Each memory cell typically stores one or two bits of data, although certain embodiments comprise memory cells storing more than two bits of data. A memory cell that can store one bit data is called a single level cell (SLC), and a memory cell that can store more than one bit of data is called a multi level cell (MLC). A SLC can assume an erase state or a program state according to a change in threshold voltage, and an MLC can assume an erase state and a plurality of program states according to a change in threshold voltage.

Referring to FIG. 3, memory cell array 110 has a cell string structure. Each cell string comprises a string selection transistor SST connected to a string selection line SSL, a plurality of memory cells MC0 through MCm-1 connected to a plurality of wordlines WL0 through WLm-1, and a ground selection transistor GST connected to a ground selection line GSL.

Here, string selection transistor SST is connected between a bitline and a string channel, and ground selection transistor GST is connected between a string channel and a common source line CSL.

Address decoder 120 is connected to memory cell array 110 via selection lines SSL and GSL and wordlines WL0 through WLm-1. Address decoder 120 receives an address ADDR during a program operation or a read operation, and selects one wordline according to the received address ADDR. The selected wordline is connected to memory cells on which a program operation or a read operation is performed.

Additionally, address decoder 120 applies bias voltages (e.g., a program voltage, a pass voltage, a string selection voltage, a ground selection voltage) necessary for a program operation or a read operation to the selected wordline, the non-selected wordlines, and selection lines SSL and GSL. In this example, the bias voltages are generated by control logic 150.

Input/output circuit 130 is connected to memory cell array 110 via bitlines BL0 through BLn-1. Input/output circuit 130 comprises a plurality of page buffers PB0 through PBn-1. Page buffers PB0 through PBn-1 temporarily store data to be programmed in memory cells connected to a selected wordline, and temporarily store data read from memory cells connected to a selected wordline.

During a program operation, a bitline program voltage (e.g., 0V) is applied to bitline connected to program cells, and a bitline inhibit voltage (e.g., a power voltage) is applied to bitlines connected to program inhibit cells. The bitline inhibit voltage can be alternatively referred to as a bitline pre-charge voltage.

Each of page buffers PB0 through PBn-1 generates a fail bit that indicates whether a program bit is properly programmed and whether an inhibit bit is properly inhibited during a program verify operation. In other words, a fail bit is generated when a program bit is not properly programmed or an inhibit bit is not properly inhibited. Each of page buffers PB0 through PBn-1 outputs the detected fail bit to fail bits indicator 140 during a program verify operation.

In some embodiments, the fail bits detected from page buffers PB0 through PBn-1 are output to fail bits indicator 140 through a shared output line. In such embodiments, the program verify operation is performed through a wired-Oring method.

In some embodiments, the fail bits detected from page buffers PB0 through PBn-1 are output to fail bits indicator 140 through each corresponding output line. In such embodiments, the program verify operation is performed through a scan method.

Fail bits indicator 140 receives the total number of fail bits from the fail bits output from page buffers PB0 through PBn-1 during a program verify operation. The program verify operation is divided into a program verify operation on program bits and a program verify operation on inhibit bits. Fail bits indicator 140 obtains the number of fail bits according to a program verify operation result regarding program bits and the number of fail bits according to a program verify operation result regarding inhibit bits.

Where a program verify operation is performed with the wired-Oring method, fail bits indicator 140 obtains the number of fail bits according to a current amount flowing through the shared output line. Where a program verify operation is performed with the scan method, fail bits indicator 140 obtains the number of fail bits by directly counting the output fail bits.

In the embodiment of FIG. 3, fail bits indicator 140 is located external to control logic 150, but is not limited to this configuration. In certain alternative embodiments, fail bits indicator 140 can be located within control logic 150.

Control logic 150 controls general operations (e.g., program/read/erase operations) of nonvolatile memory device 100. Control logic 150 performs program/read/erase operations according to control signals CTRL provided from an external source.

Control logic 150 controls address decoder 120 and input/output circuit 130 to perform a program operation using ISPP. Control logic 150 generates a program voltage with a voltage level that corresponds to a number of loops that have been performed in the program operation. The generated program voltage is provided to a selected wordline, and control logic 150 generates a pass voltage that is provided to the non-selected wordlines.

Control logic 150 determines program completion according to the number of fail bits output from fail bits indicator 140 during the program operation. For example, in some embodiments, where the total number of fail bits falls below a predetermined value, control logic 150 finishes the program operation. In some embodiments, where the number of fail bits in a current program operation is greater than the number of fail bits in a previous program operation, control logic 150 finishes the program operation.

Nonvolatile memory device 100 finishes a program operation according to the total number of fail bits corresponding to selected memory cells. Accordingly, nonvolatile memory device 100 can improve reliability of a memory cell and can reduce the number of error bits during a program operation.

Figure 4:
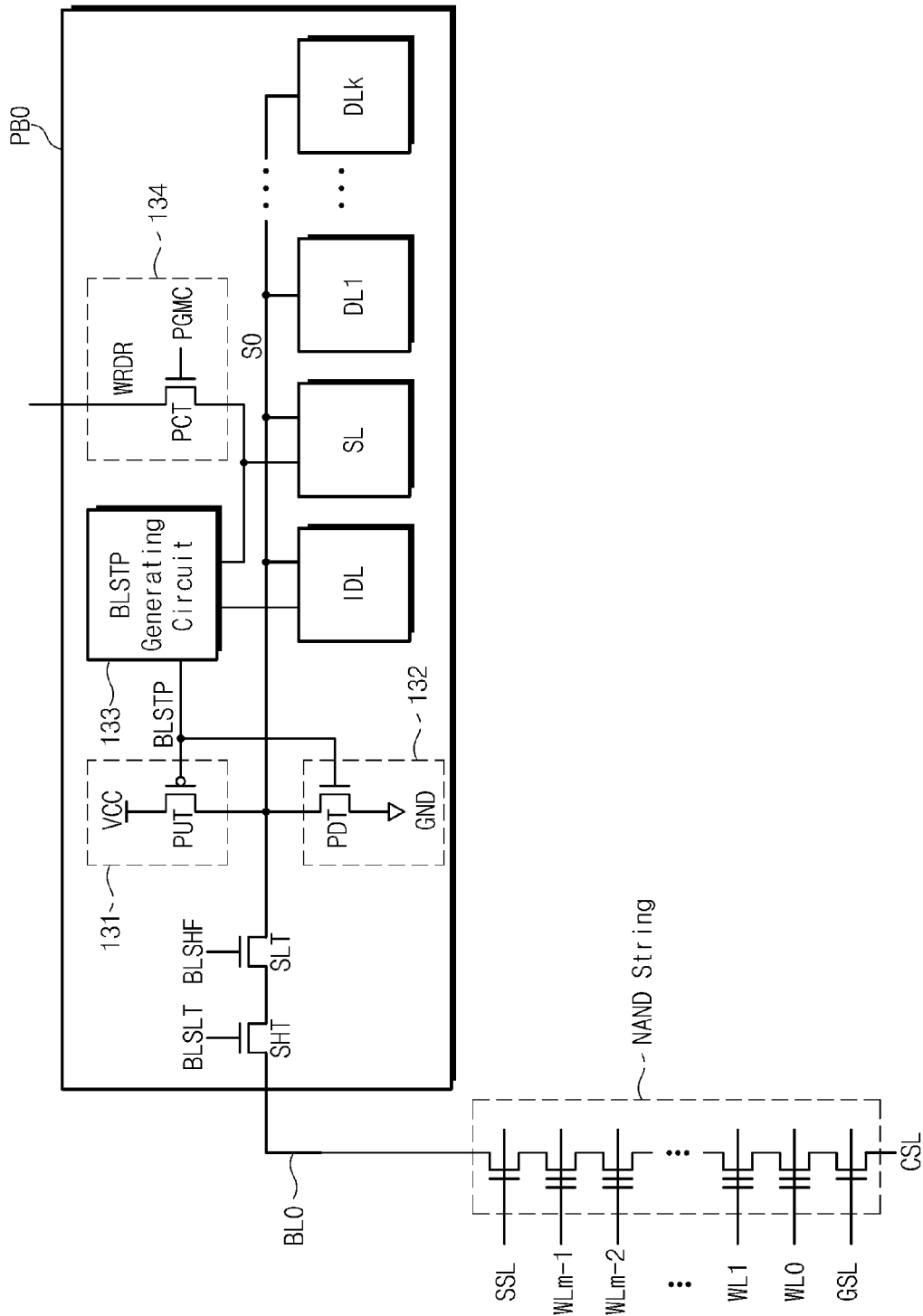
FIG. 4 is a diagram illustrating a portion of a page buffer and memory cell array shown in FIG. 3.

FIG. 4 is a diagram illustrating a page buffer PB0 and a portion of memory cell array 110 of FIG. 3. Referring to FIG. 4, page buffer PB0 comprises a bitline pull up circuit 131, a bitline pull down circuit 132, a bitline setup signal (BLSTP) generating circuit 133, a fail bit check circuit 134, a bitline control transistor SHT, a bitline selection transistor SLT, an inhibit data latch IDL, a sense latch SL, and a plurality data latches DL0 through DLk. Page buffer PB0 detects a fail bit during a program verify operation. The fail bits include failed program bits and disturbed inhibit bits. Page buffer PB0 typically detects failed program bits and disturbed inhibit bits simultaneously during a program verify operation.

Bitline pull up circuit 131 is connected between a power voltage VCC and a sense node S0. Bitline pull up circuit 131 provides a voltage for pre-charging bitline BL0 to sense node S0. Bitline pull up circuit 131 comprises a drain connected to power voltage VCC, a gate receiving a bitline setup signal BLSTP, and a PMOS transistor PUT having a source connected to sense node S0.

Bitline pull up circuit 131 provides power voltage VCC to sense node S0 in response to bitline setup signal BLSTP. Here, bitline setup signal BLSTP is provided from BLSTP generation circuit 133.

Bitline pull down circuit 132 is connected between sense node S0 and a ground voltage GND of 0V. Bitline pull down circuit 132 is connected to sense node S0 to apply 0V to bitline BL0. Bitline pull down circuit 132 comprises a drain connected to sense node S0, a gate receiving bitline setup signal BLSTP, and an NMOS transistor PDT having a source connected to ground voltage GND. Bitline pull down circuit 132 provides 0V to sense node S0 in response to bitline setup signal BLSTP. Here, bitline setup signal BLSTP is provided from BLSTP generation circuit 133.

BLSTP generating circuit 133 generates bitline setup signal BLSTP to determine a level of sense node S0. Although not illustrated in FIG. 4, bitline setup signal BLSTP can be provided from control logic 150.

BLSTP generating circuit 133 generates bitline setup signal BLSTP according to data stored in inhibit data latch IDL and data stored in sense latch SL during a program verify operation. Data stored in inhibit data latch IDL is an inhibit bit (e.g., data '1 ') and data stored in sense latch SL is data indicating whether a corresponding memory cell is programmed during a program verify operation. For example, where the memory cell is programmed, sense latch SL stores data '1 '. On the other hand, where the memory cell is not programmed, sense latch SL stores data '0'.

BLSTP generating circuit 133 generates bitline setup signal BLSTP that indicates program pass or program fail according to data stored in inhibit data latch IDL and sense latch SL during a program verify operation. Here, program pass means that a program bit is properly programmed or an inhibit bit is properly inhibited. Additionally, program fail means that a program bit is not properly programmed (i.e., a failed program bit), or an inhibit bit is programmed (i.e., a disturbed inhibit bit).

Table 1 below illustrates values of bitline setup signal BLSTP generated by BLSTP generating circuit 133 according to data latched in inhibit data latch IDL and data latched in sense latch SL.

TABLE 1

| IDL | SL | BLSTP |
|---|---|---|
| 1 (Inhibit bit) | 0 (Inhibit state) | 1 (Pass) |
| 0 (Program bit) | 1 (Program state) | 1 (Pass) |
| 1 (Inhibit bit) | 1 (Program state) | 0 (Fail) |
| 0 (Program bit) | 0 (Inhibit state) | 0 (Fail) |

During a program verify operation, BLSTP generating circuit 133 generates bitline setup signal BLSTP according to Table 1. In response to the generated bitline setup signal BLSTP, a level of sense node S0 is determined, and data of sense latch SL to be output are determined according to the determined level of sense node S0.

Referring to Table 1, a fail bit detection operation of page buffer PB0 will proceed as follows.

Where data '1 ' is received and a corresponding inhibit bit is properly inhibited during a program operation, sense latch SL initially stores data '0 '. BLSTP generating circuit 133 receives a value of data '1 ' stored in inhibit data latch IDL and data '0 ' stored in sense latch SL to output data '1 ' during a fail bit detection. Accordingly, sense node S0 assumes a high level state, and sense latch SL stores data '1 '. Thereafter, data '1 ' stored in sense latch SL is output by fail bit check circuit 134. Data '1 ' output from sense latch SL indicates program pass.

Where data '0 ' is received and a corresponding program bit is properly programmed during a program operation, sense latch SL initially stores data '1 '. BLSTP generating circuit 133 receives a value of data '0 ' stored in inhibit data latch IDL and data '1 ' stored in sense latch SL to output data '1 ' during a fail bit detection. Accordingly, a level of sense node S0 assumes a high level state, and sense latch SL stores data '1 '. Thereafter, data '1 ' stored in sense latch SL is output by fail bit check circuit 134. Data '1 ' output from sense latch SL indicates program pass.

Where data '1 ' is received and a corresponding inhibit bit is not properly inhibited during a program operation, sense latch SL initially stores data '1 '. BLSTP generating circuit 133 receives a value of data '1 ' stored in inhibit data latch IDL and data '1 ' stored in sense latch SL to output data '0 ' during a fail bit detection. Accordingly, a level of sense node S0 assumes a low level state, and sense latch SL stores data '0 '. Thereafter, data '0 ' stored in sense latch SL is output by fail bit check circuit 134. Data '0 ' output from sense latch SL means program fail.

Where data '0 ' is received and a corresponding program bit is not properly programmed during a program operation, sense latch SL initially stores data '0 '. BLSTP generating circuit 133 receives a value of data '0 ' stored in inhibit data latch IDL and data '0 ' stored in sense latch SL to output data '0 ' during a fail bit detection. Accordingly, a level of sense node S0 assumes a low level state, and sense latch SL stores data '0 '. Thereafter, data '0 ' stored in sense latch SL is output by fail bit check circuit 134. Data '0 ' output from sense latch SL means program fail.

Fail bit check circuit 134 is connected to sense latch SL. Fail bit check circuit 134 verifies program pass or program fail according to data that are finally stored in sense latch SL during a program verify operation. In other words, fail bit check circuit 134 outputs a fail bit (e.g., data '0 ') stored in sense latch SL to fail bits indicator 140 during a program verify operation.

Fail bit check circuit 134 outputs data stored in sense latch SL in a program verify operation in response to a program check signal PGMC. The output data value is delivered to fail bits indicator 140 through a wired-Oring method or a scan method as indicated above.

Bitline control transistor SHT prevents a high voltage from being delivered to sense node S0 in response to bitline control signal BLSHF. In other words, bitline control transistor SHT is used to protect page buffer PB0 from a high voltage applied to bitline BL0. In this embodiment, bitline control signal BLSHF is provided from control logic 150.

Bitline selection transistor SLT is connected between one end of bitline control transistor SHT and bitline BL0. Bitline selection transistor SLT connects bitline BL0 with page buffer PB0 in response to bitline selection signal BLSLT. In this embodiment, bitline selection signal BLSLT is provided from control logic 150.

Inhibit data latch IDL stores a program bit (e.g., data '0 ') or an inhibit bit (e.g., data '1 ') received during a program operation. The data stored in inhibit data latch IDL is used to detect a fail bit in a program verify operation.

Sense latch SL detects a voltage level of bitline BL0 to store data of a memory cell connected to bitline BL0 or data latched in one of data latches DL0 through DLk in a program or read operation. Data latches DL0 through DLk store data received during a program operation or data latched in sense latch SL.

Although not shown, the remaining page buffers PB1 through PBn-1 can be implemented substantially identical to page buffer PB0 of FIG. 4.

In FIG. 4, page buffer PB0 comprises one inhibit data latch IDL. The inventive concept is not limited, however, to a single inhibit data latch. For example, where a plurality of inhibit bits are set during a program operation, a plurality of inhibit data latches can be used to store a plurality of inhibit bits. For simplicity, erased bits are assumed to constitute inhibit bits in this description.

Page buffer PB0 can be used in a least significant bit (LSB) program operation or a most significant bit (MSB) program operation. During the LSB program operation, bit data corresponding to an erase state is stored in inhibit data latch IDL. During an LSB program verify operation, page buffer PB0 outputs a fail bit based on data stored in inhibit data latch IDL and data stored in sense latch SL.

During an MSB program operation, page buffer PB0 generates an inhibit bit (e.g., data '1') corresponding to a program inhibit state using a combination of data read during an LSB read operation and received input data, and stores the generated inhibit bit in inhibit data latch IDL. During an MSB program verify operation, page buffer PB0 outputs a fail bit using data stored in inhibit data latch IDL and data stored in sense latch SL.

Figure 5:
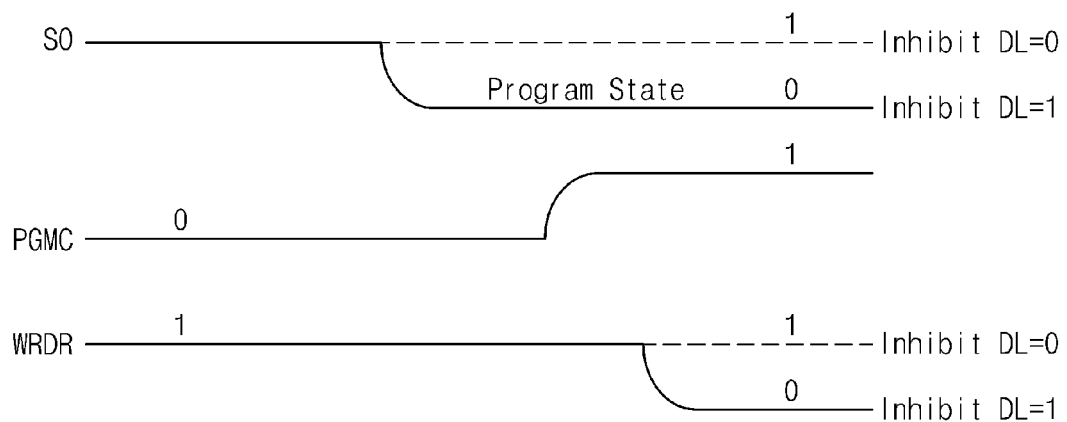
FIG. 5 is a timing diagram illustrating a method of detecting a fail bit in a program verify operation performed by page buffer of FIG. 4.

FIG. 5 is a timing diagram illustrating a method of detecting a fail bit in a program verify operation performed by the page buffer of FIG. 4. For simplicity of explanation, the description is limited to a program verify method for an inhibit bit.

Sense node S0 must maintain a high level state to maintain an inhibit bit during a program operation. Bitline setup signal BLSTP is generated according to data stored in inhibit data latch IDL to allow a level of sense node S0 to be a high level state. Then, sense latch SL detects a high level state of sense node S0 and fail bit check circuit 134 outputs a state of data '1' that is detected in response to program verify signal PGMC. The state of the output data '1' indicates that a program operation is passed.

Inhibit data latch IDL prevents program pass from being output unconditionally even where a level of sense node S0 is a high level during a program verify operation. For example, an inhibit bit (e.g., data '1') is disturbed where a level of sense node S0 is a high level state and data latched in inhibit data latch IDL is '1', an inhibit bit (e.g., data '1') is disturbed. That is, an inhibit bit is programmed during a program operation. Accordingly, BLSTP generating circuit 133 generates bitline setup signal BLSTP to change sense node S0 to a low level state from a high level state using data latched in inhibit data latch IDL.

In response to the generated bitline setup signal BLSTP, a level of sense node S0 assumes a low level state. Sense latch SL detects sense node S0 of a low level state to store data '0'. Thereafter, fail bit check circuit 134 outputs a state of data '0' stored in sense latch SL to an output line WRDR in response to the program verify signal PGMC. The output data '0' indicates that a program operation is failed.

As indicated by the foregoing, a page buffer detects program pass or program fail according to data output from fail bit check circuit 134 during a program verify operation.

Figure 6:
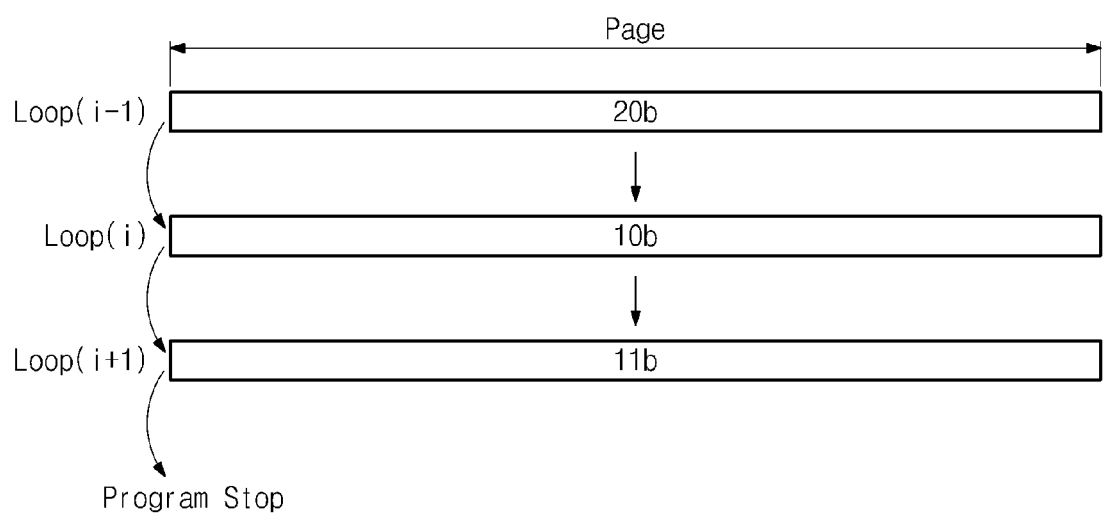
FIG. 6 is a diagram illustrating a method of determining a program finish point in the nonvolatile memory device of FIG. 3 according to an embodiment of the inventive concept.

FIG. 6 is a diagram illustrating a method of determining a program finish point in the nonvolatile memory device of FIG. 3 according to an embodiment of the inventive concept. Referring to FIG. 6, where 20 fail bits are detected during a program verify operation in a loop i−1, 10 fail bits are detected during a program verify operation in the next loop "i", and 11 fail bits are detected during a program verify operation in the next loop i+1, the program operation is finished.

Control logic 150 of FIG. 3 stores a number of fail bits of a previous loop, compares the stored number of fail bits of a previous loop with a number of fail bits of a current loop, and finishes a program operation where the number of fail bits increases based on a result of the comparison. In addition, where the number of fail bits after program completion is greater than the maximum number of bits that can be corrected through the use of an error correction code, the program operation is deemed a failure.

Nonvolatile memory device 100 finishes a program operation according to an increase in the number of fail bits. For example, a program operation can be finished at a loop where the number of fail bits is increased after first being decreased.

In FIG. 6, the number of fail bits is monitored by a page unit. However, the inventive concept is not limited thereto. For instance, in an alternative embodiment, nonvolatile memory device 100 can monitor a change state of the number of fail bits by at least one sector unit. In this embodiment, error correction is typically performed by at least one sector unit, and an error correction code value corresponding to at least one sector is stored in a spare region of a page.

Figure 7:
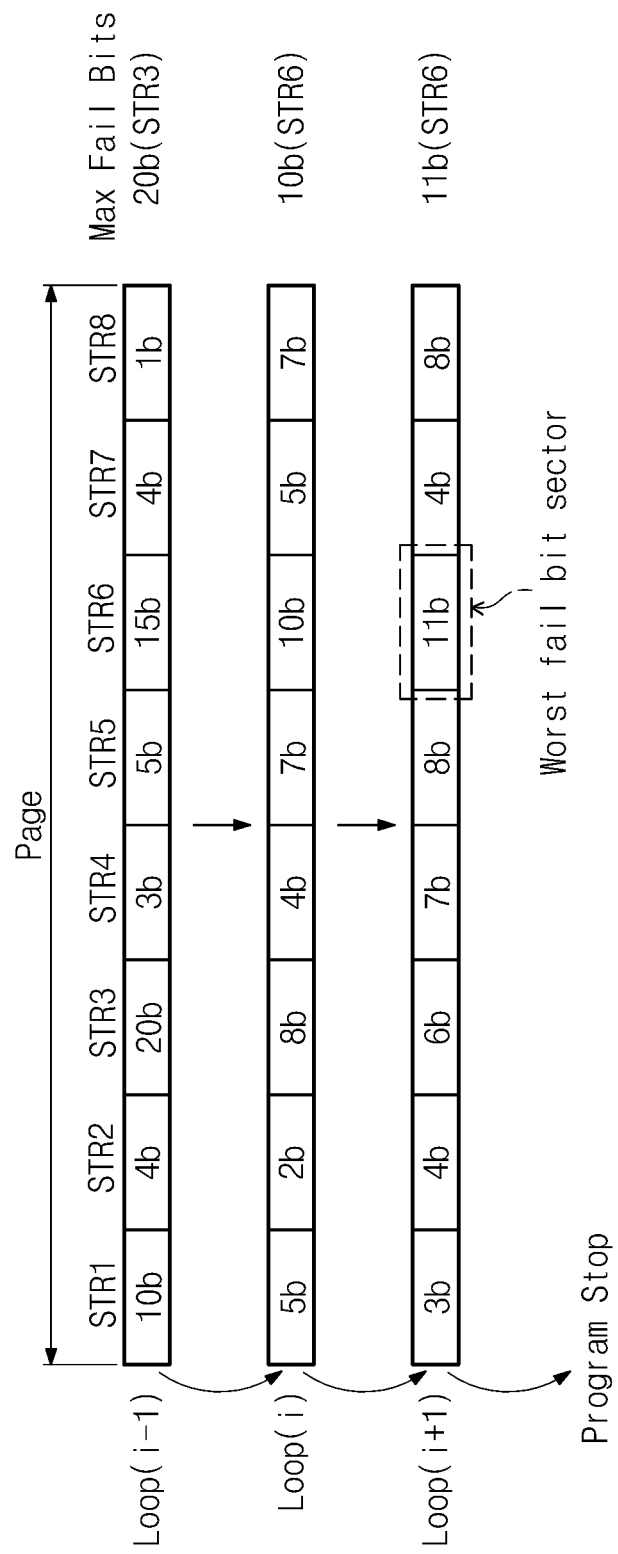
FIG. 7 is a diagram illustrating a method of determining a program finish point in the nonvolatile memory device of FIG. 3 according to an embodiment of the inventive concept.

FIG. 7 is a diagram illustrating a method of determining a program finish point in the nonvolatile memory device of FIG. 3 according to an embodiment of the inventive concept. In this embodiment, a page is divided into 8 sectors STR1 through STR8.

Fail bits indicator 140 of FIG. 3 detects the number of fail bits in a sector unit. The number of fail bits detected in sectors STR1 through SRT8 is delivered to control logic 150 of FIG. 3. Control logic 150 stores the largest number of fail bits among the numbers of fail bits of the sectors STR1 through SRT8.

For example, as shown in FIG. 7, a number of fail bits 20b of third sector STR3 is stored at a loop i−1, a number of fail bits 10b of the sixth sector STR6 is stored at a loop "i", and a number of fail bits 11b of sixth sector STR6 is stored at a loop i+1. Here, sixth sector STR6 is designated as the worst fail bit sector, where the term "worst fail bit sector" means a sector that has a largest number of fail bits among sectors and has a larger number of fail bits than in a previous loop.

Control logic 150 determines program completion according to the stored number of fail bits. For example, where the total number of fail bits of worst fail bit sector STR6 is increased after being decreased, control logic 150 finishes a program operation.

Figure 8:
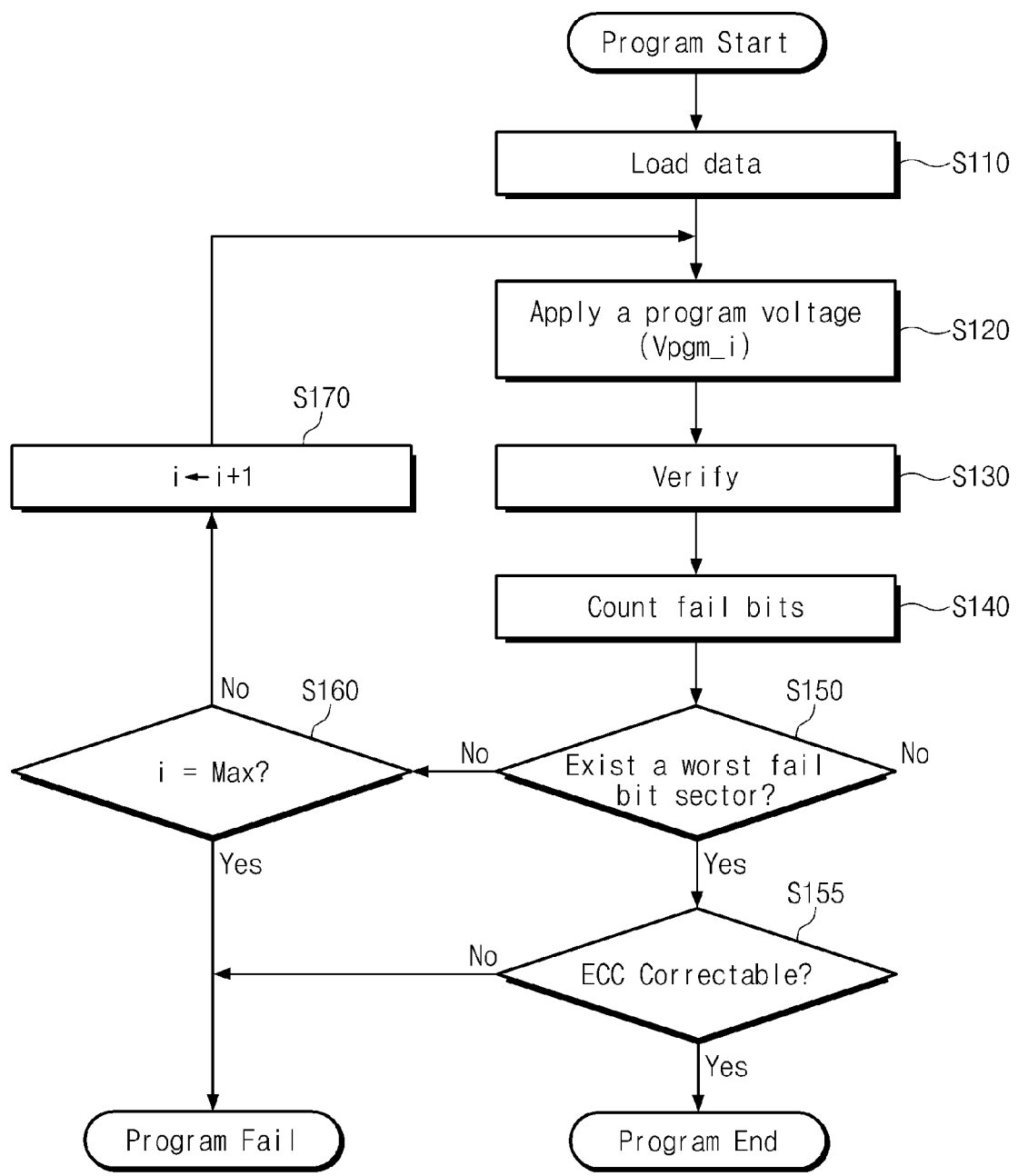
FIG. 8 is a flowchart illustrating a method of programming the nonvolatile memory device of FIG. 3 according to an embodiment of the inventive concept.

FIG. 8 is a flowchart illustrating a method of programming the nonvolatile memory device of FIG. 3 according to an embodiment of the inventive concept.

Referring to FIGS. 3, 4, and 8, the programming method begins by loading data to be programmed into each of page buffers PB0 through PBn-1 of input/output circuit 130 (S110). Additionally, control logic 150 generates bias voltages necessary for a program operation. Thereafter, control logic 150 performs a program loop.

Control logic 150 sets voltages for bitlines BL0 through BLn-1 according to the data loaded in page buffers PB0 through PBn-1. For example, the ground voltage of 0V is applied to bitlines connected to page buffers where a program bit is loaded, and a pre-charge voltage (i.e., a power voltage) is applied to bitlines connected to page buffers where an inhibit bit is loaded.

Thereafter, a pass voltage is applied to non-selected wordlines, and a program voltage Vpgm_i is applied to a selected wordline (S120). A level of program voltage Vpgm_i is increased by a predetermined value as the number of loops "i" is increased. A pass voltage is applied to the selected wordline for a predetermined time after program voltage Vpgm_i is applied. Then, a program recovery operation is performed. During the program recovery operation, the bias voltages applied to wordlines WL0 through WLm-1 and string selection line SSL are discharged, and the voltages applied to bitlines BL0 through BLn-1 are discharged.

Subsequently, a program verify operation is performed to determine whether a program operation is properly programmed (S130). The program verify operation determines data stored in a memory cell to be programmed using a verify read voltage (or, in a MLC, using a plurality of verify read voltages). Fail bit check circuit 134 of FIG. 4 outputs data latched in sense latch SL via output line WRDR in response to program verify signal PGMC.

Fail bits indicator 140 obtains the total number of fail bits by detecting data output from each of page buffers PB0 through PBn-1 via output line WRDR. For example, fail bits indicator 140 detects the number of fail bits by detecting an amount of current flowing through output line WRDR. Fail bits indicator 140 can also obtain the number of fail bits by directly counting output fail bits.

Control logic 150 of FIG. 3 determines whether a worst fail bit sector exists (S150). The worst fail bit sector is a sector having a largest number of fail bits among a plurality of sectors, and having a greater fail bit value than in a previous loop. Where there is the worst fail bit sector, control logic 150 determines whether a fail bit value in the worst fail bit sector is error-correctible, i.e., whether the number of fail bits is small enough to be corrected (S155). Where the fail bit value in the worst fail bit sector is error-correctible, the program operation is terminated. Otherwise, where the fail bit value in the worst fail bit sector is not error-correctible, the program operation is deemed a failure.

Where there is no worst fail bit sector, the method determines whether the number of loops "i" is equal to a maximum value (S160). Where the number of loops "i" is equal to the maximum value, the program operation is deemed a failure. On the other hand, where the number of loops "i" is not equal to the maximum value, the number of loops "i" is incremented by one (S170) and the method returns to step S120.

Figure 9:
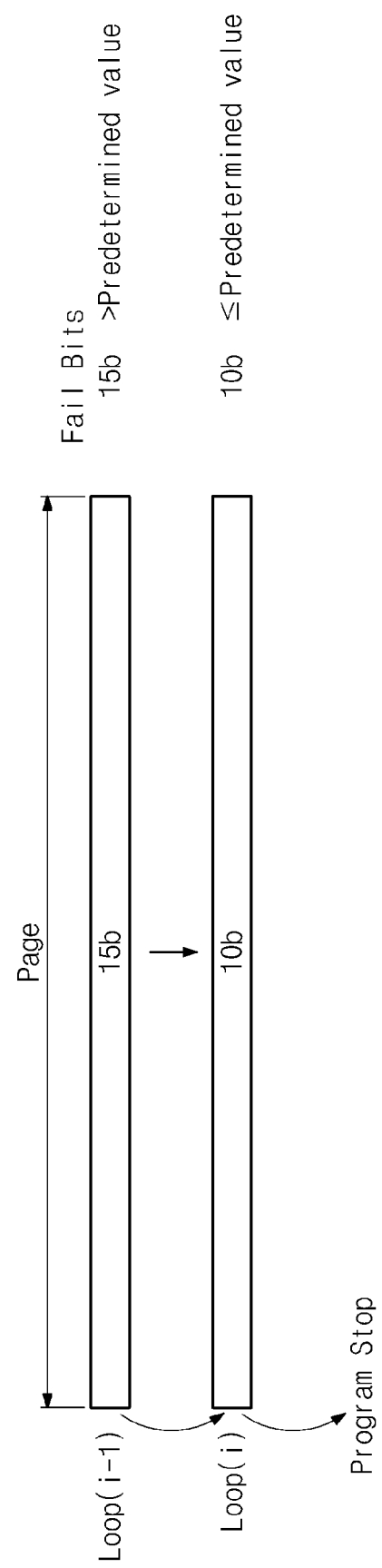
FIG. 9 is a diagram illustrating a method of determining a program finish point in the nonvolatile memory device of FIG. 3 according to an embodiment of the inventive concept.

FIG. 9 is a diagram illustrating a method of determining a program finish point in the nonvolatile memory device of FIG. 3 according to an embodiment of the inventive concept. Referring to FIG. 9, where 15 fail bits are detected in a program verify operation at a loop i−1 and 10 fail bits are detected during a program verify operation at a next loop "i", the program operation is finished. The number of the detected 10 fail bits in loop "i" is less than a predetermined value. The predetermined value is typically less than a maximum number of errors that can be corrected through the use of an error correction code.

Nonvolatile memory device 100 finishes a program operation where the number of fail bits is less than or equal to the predetermined value.

In FIG. 9, the number of fail bits is monitored in units of a page. However, the inventive concept is not limited thereto. For instance, in an alternative embodiment, nonvolatile memory device 100 can monitor the number of fail bits by at least one sector unit. In this embodiment, error correction is possible in at least one sector unit, and an error correction code value corresponding to at least one sector is stored in a spare region of a page.

Figure 10:
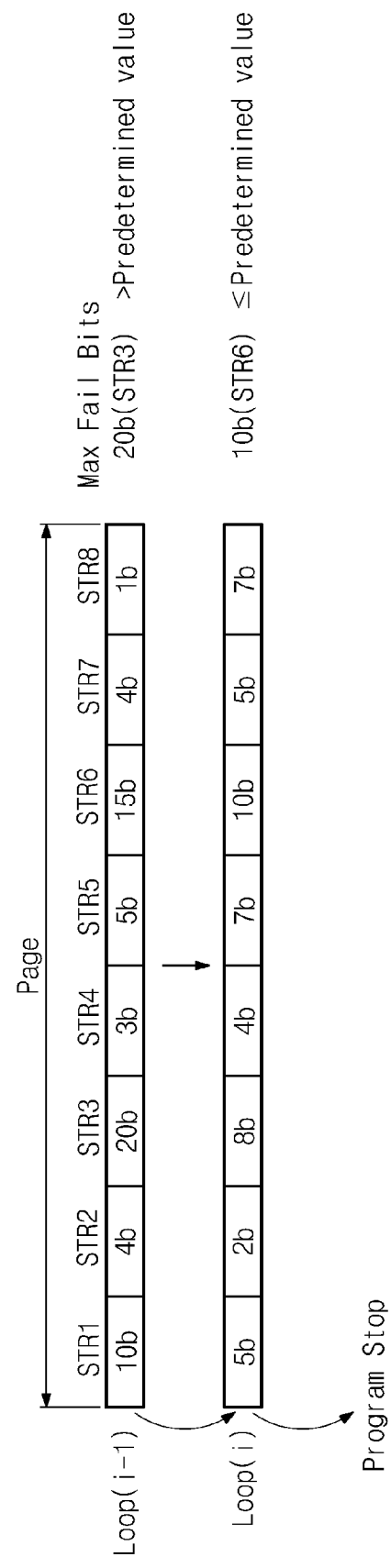
FIG. 10 is a diagram illustrating a method of determining a program finish point in the nonvolatile memory device of FIG. 3 according to an embodiment of the inventive concept.

FIG. 10 is a diagram illustrating a method of determining a program finish point in the nonvolatile memory device of FIG. 3 according to an embodiment of the inventive concept. Referring to FIG. 10, one page is divided into 8 sectors STR1 through STR8.

Fail bits indicator 140 of FIG. 3 detects the number of fail bits by a sector unit. The number of fail bits detected from the sectors STR1 through SRT8 is delivered to control logic 150 of FIG. 3.

Control logic 150 finds the sector having the largest number of fail bits among sectors STR1 through SRT8 and stores the largest number. Next, control logic 150 determines whether the stored largest number of fail bits is greater than the predetermined value. Where the total number of fail bits is greater than the predetermined value, control logic 150 performs a program loop. For example, as shown in FIG. 10, the number of fail bits of the third sector STR3 is 20 (i.e., the largest number of fail bits) at a loop i−1. At this point, the total number of fail bits is greater than the predetermined value, so control logic 150 performs a loop "i".

On the other hand, where the total number of fail bits is not greater than the predetermined value, control logic 150 finishes the program operation. For example, as shown in FIG. 10, the number of fail bits of the sixth sector STR6 is 10 (i.e., the largest number of fail bits) in loop "i". At this point, the total number of fail bits is not greater than the predetermined value, so control logic 150 finishes the program operation.

Nonvolatile memory device 100 finishes a program operation where the number of fail bits of the sector with the most fail bits is not greater than the predetermined value.

Figure 11:
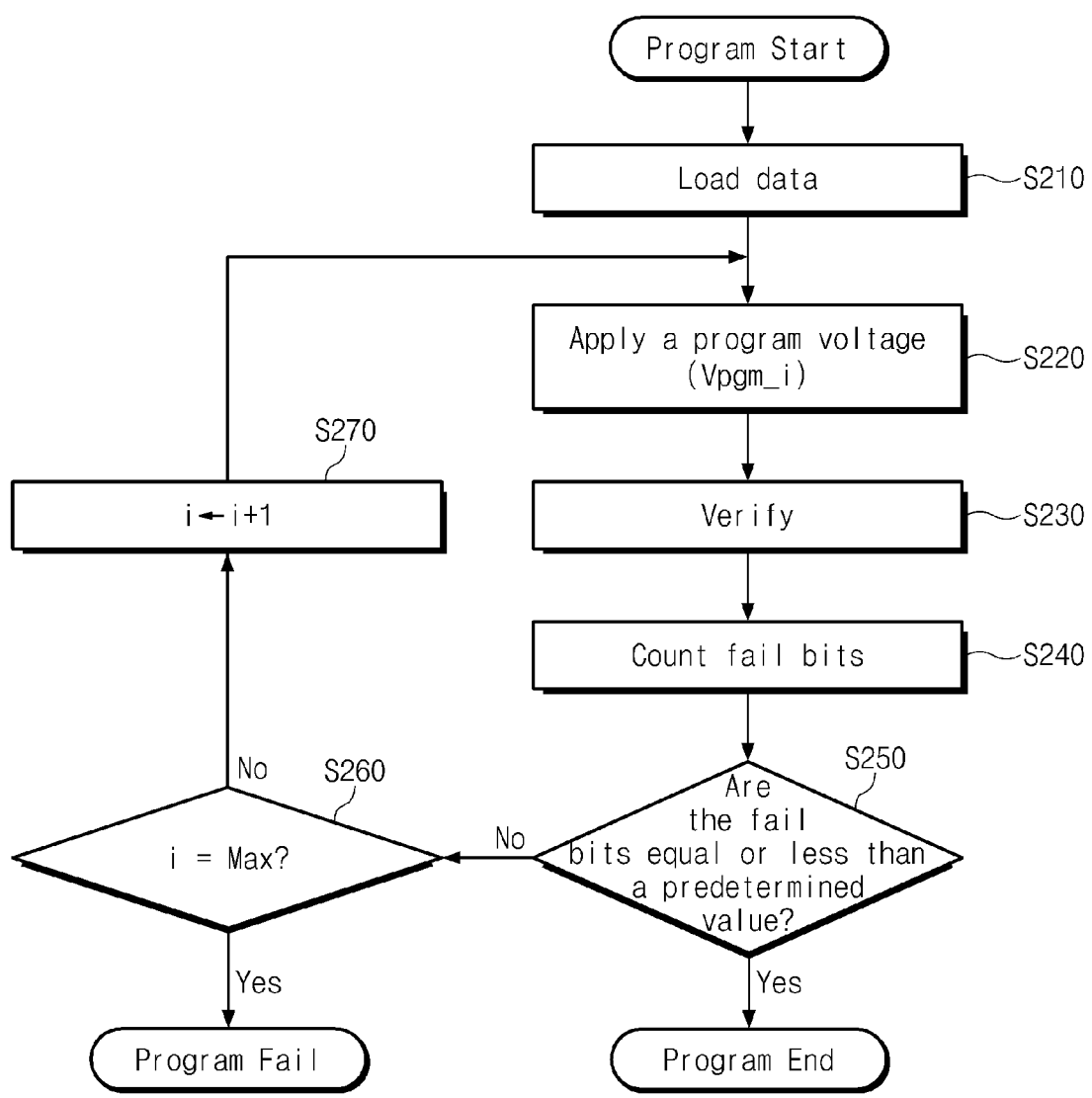
FIG. 11 is a flowchart illustrating a method of programming the nonvolatile memory device of FIG. 3 according to an embodiment of the inventive concept.

FIG. 11 is a flowchart illustrating a method of programming the nonvolatile memory device of FIG. 3 according to another embodiment of the inventive concept.

In the method of FIG. 11, a program operation begins by loading program data into each of page buffers PB0 through PBn-1 of input/output circuit 130 (S210). Thereafter, control logic 150 generates bias voltages necessary for a program operation and applies the bias voltages to a selected wordline and selected bitlines connected to the memory cells to be programmed. Using the bias voltages, control logic 150 performs a program loop.

In the program loop, control logic 150 sets up bitlines BL0 through BLn-1 according to data loaded in page buffers PB0 through PBn-1. For example, the ground voltage of 0V is typically applied to bitlines connected to page buffers storing program bits (e.g., data '1 '), and a pre-charge voltage (i.e., a power voltage) is applied to bitlines connected to page buffers storing inhibit bits (data '0').

Subsequently, a pass voltage is applied to non-selected wordlines, and a program voltage Vpgm_i is applied to a selected wordline (S220). The level of program voltage Vpgm_i is increased by a predetermined value as the number of loops "i" is increased. A pass voltage can be applied to the selected wordline for a predetermined time before program voltage Vpgm_i is applied. Then, a program recovery operation is performed. During the program recovery operation, the bias voltages applied to wordlines WL0 through WLm-1 and string selection line SSL are discharged, and the voltages applied to bitlines BL0 through BLn-1 are discharged.

Following the program recovery operation, a program verify operation is performed to determine whether the program operation is properly programmed (S230). The program verify operation uses a verify read voltage (or voltages) to determine whether data has been successfully stored in selected memory cells. Fail bit check circuit 134 of FIG. 4 outputs data latched in sense latch SL via output line WRDR in response to program verify signal PGMC.

Fail bits indicator 140 obtains the total number of fail bits by detecting the data output from each of page buffers PB0 through PBn-1 via output line WRDR.

Next, control logic 150 of FIG. 3 determines whether there is a worst fail bit sector in sectors being programmed (S250). This can be accomplished, for instance, by determining whether the number of fail bits in any sector being programmed in a current loop is greater than a predetermined number.

Where there is no worst fail bit sector, control logic 150 finishes the program operation. Otherwise, where there is a worst fail bit sector, the method determines whether the number of loops "i" is equal to a maximum value (S260). Where the number of loops "i" is equal to the maximum value, the program operation is deemed a failure. On the other hand, where the number of loops "i" is not equal to the maximum value, the number of loops "i" is incremented (S270) and the method returns to step S220.

In FIGS. 3 through 11, nonvolatile memory device 100 stores inhibit bits used for a program verify operation in page buffers, but the inventive concept is not limited thereto. For instance, inhibit bits used for a program verify operation can be stored in other devices besides the page buffer, such as in a temporary memory block.

Figure 12:
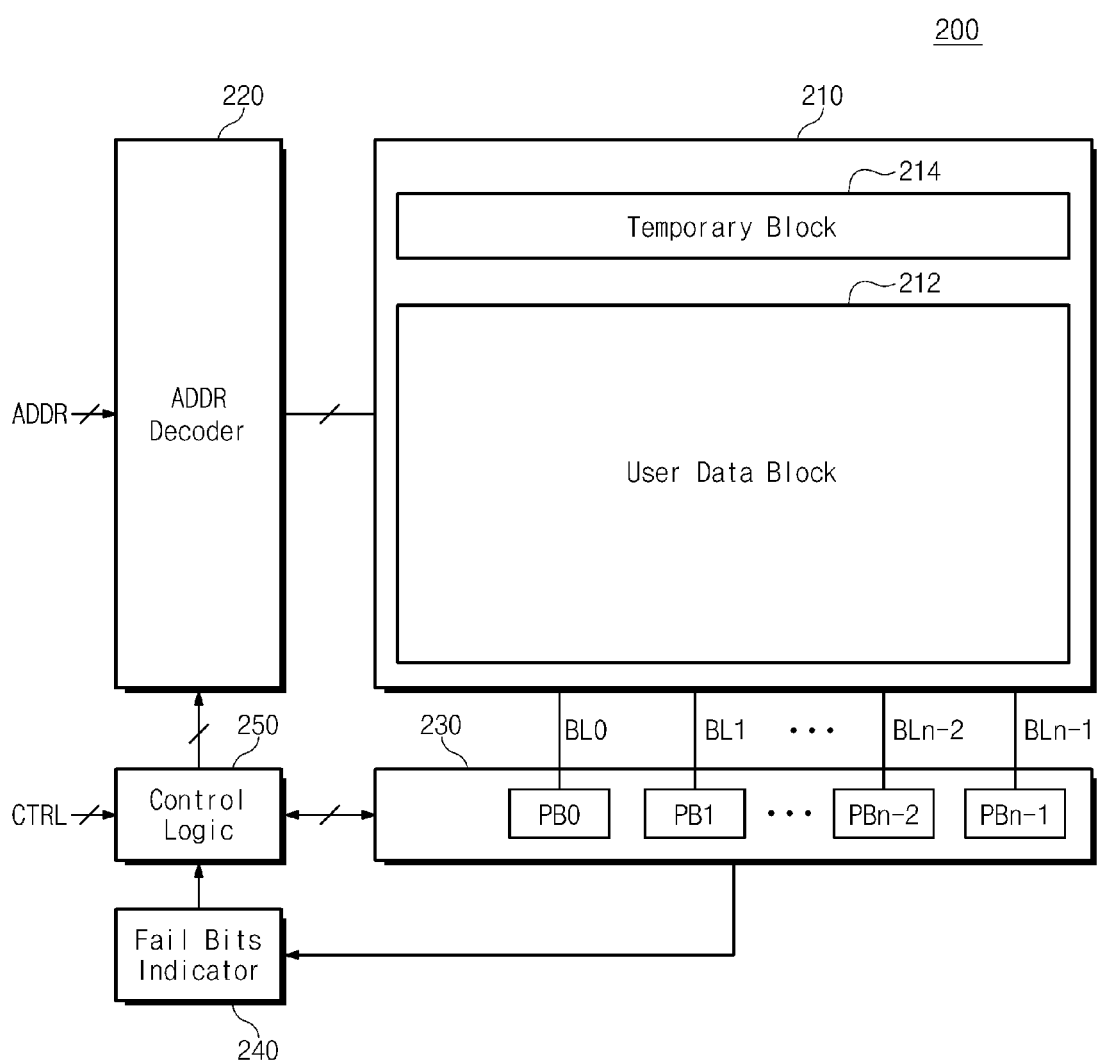
FIG. 12 is a block diagram of a nonvolatile memory device according to an embodiment of the inventive concept.

FIG. 12 is a block diagram of a nonvolatile memory device according to another embodiment of the inventive concept. Referring to FIG. 12, a flash memory 200 comprises a memory cell array 210, an address decoder 220, an input/output circuit 230, a fail bits indicator 240, and control logic 250.

Memory cell array 210 comprises a user data block 212 and a temporary block 214. User data block 212 and temporary block 214 are configured identical to the memory block of FIG. 3. Temporary block 214 provides space for storing information regarding inhibit bits in a program operation. The information regarding the inhibit bits can comprise, for instance, location information of the inhibit bits.

Once a current temporary block 214 becomes filled up, a new temporary block 214 is formed among user data blocks 212 and the current temporary block 214 is erased. Once erased, the current temporary block 214 becomes one or user data blocks 212. Mapping management for temporary block 214 is typically performed by a memory controller (not shown).

Address decoder 220 receives an address ADDR during a program operation or a read operation, and selects a wordline according to the received address ADDR. The selected wordline is connected to memory cells on which a program operation or a read operation is performed.

Input/output circuit 230 is connected to memory cell array 210 via bitlines BL0 through BLn-1 and comprises a plurality of page buffers PB0 through PBn-1. Page buffers PB0 through PBn-1 temporarily store data to be programmed in memory cells connected to a selected wordline, and temporarily store data read from memory cells connected to the selected wordline.

Fail bits indicator 240 obtains the total number of fail bits during a program verify operation. The program verify operation comprises a program verify operation for program bits and a program verify operation for inhibit bits. The program verify operation for inhibit bits is performed by controlling sense latches of page buffers PB0 through PBn-1 according to inhibit bits read from temporary block 214.

Control logic 250 controls operations of nonvolatile memory device 200, such as program, read, and erase operations. Control logic 250 performs program, read, and erase operations in response to control signals CTRL received from an external source.

Control logic 250 controls address decoder 220 and input/output circuit 230 to perform a program operation using ISPP. In the program operation, control logic 250 generates a program voltage with a voltage level that increases with successive program loops and provides the generated program voltage to a selected wordline. Control logic 250 generates a pass voltage and provides the pass voltage to the non-selected wordlines during the program operation.

Control logic 250 determines program completion according to the total number of fail bits output from fail bits indicator 240 during the program operation. For example, where the total number of fail bits is less than or equal to the predetermined value, control logic 250 finishes the program operation. In an alternative embodiment, where the number of fail bits in a current program loop is increased relative to the number of fail bits in a previous program operation, control logic 250 finishes the program operation.

Figure 13:
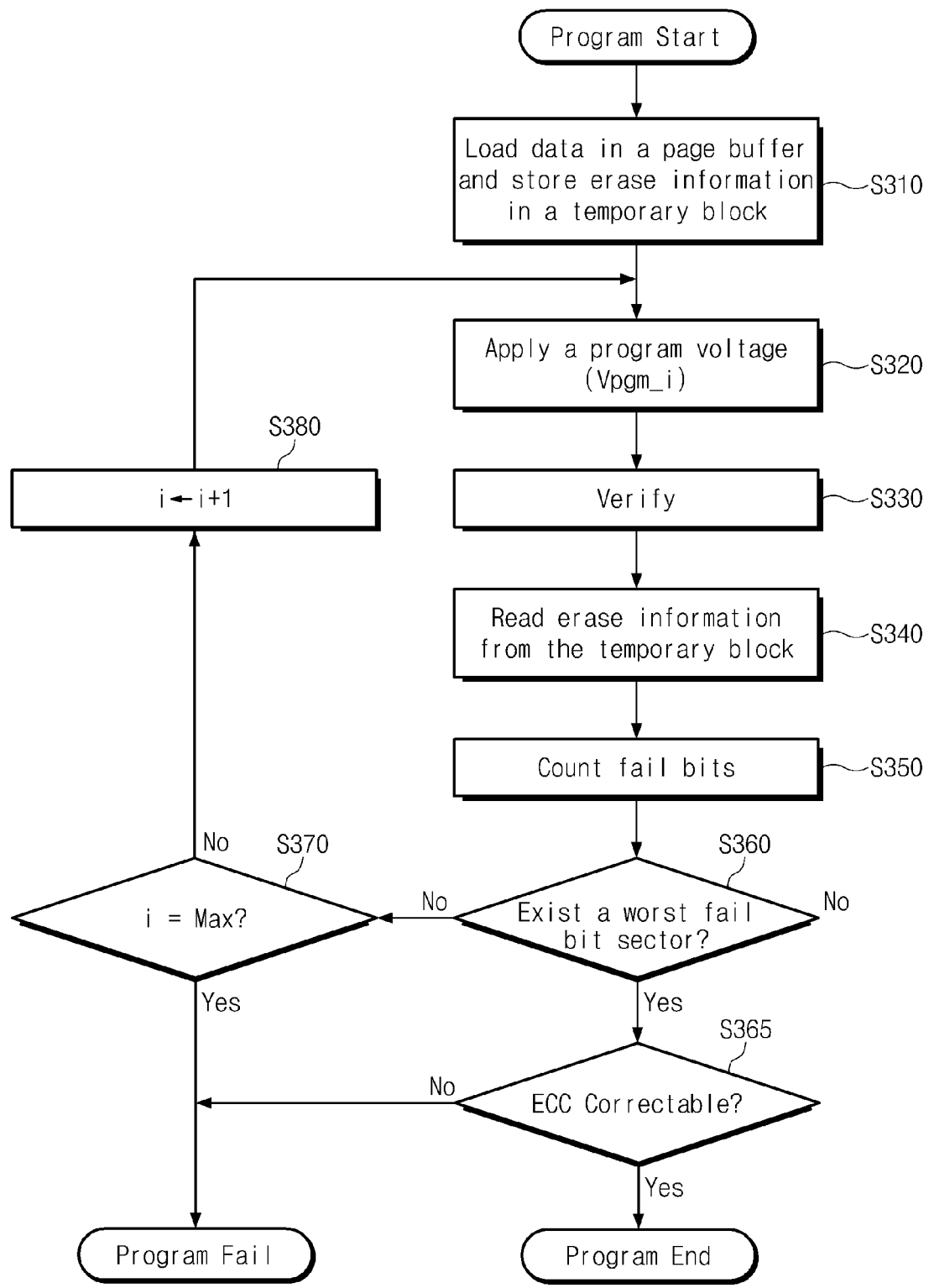
FIG. 13 is a flowchart illustrating a method of programming the nonvolatile memory device of FIG. 12 according to an embodiment of the inventive concept.

FIG. 13 is a flowchart illustrating a method of programming the nonvolatile memory device of FIG. 12 according to an embodiment of the inventive concept.

In the method of FIG. 13, a program operation begins by loading data to be programmed into page buffers PB0 through PBn-1 of input/output circuit 230 of FIG. 3 and loading inhibit bit information in temporary block 214 of FIG. 12 (S310). Control logic 250 also generates bias voltages for the program operation. Control logic 250 performs a program loop.

Control logic 350 sets voltages for bitlines BL0 through BLn-1 according to data loaded in page buffers PB0 through PBn-1. Thereafter, a pass voltage is applied to non-selected wordlines, and a program voltage $V_{pgm\_i}$ is applied to a selected wordline (S320). The level of program voltage $V_{pgm\_i}$ is increased by a predetermined value as the number of loops "i" is increased. A pass voltage can be applied to the selected wordline for a predetermined time before program voltage $V_{pgm\_i}$ is applied. Next, a program recovery operation is performed. During the program recovery operation, the bias voltages applied to wordlines WL0 through WLm-1 and string selection line SSL are discharged, and voltages applied to bitlines BL0 through BLn1 are discharged.

Subsequently, a program verify operation is performed to determine whether the program operation is properly programmed (S330). The program verify operation determines data stored in selected memory cells using a verify read voltage or voltages.

Next, inhibit bit information is read from temporary block 214 (S340). The read information is stored in a data latch within page buffers PB0 through PBn-1 of FIG. 12.

Each of page buffers PB0 through PBn-1 detects a fail bit using data read in the verify read operation and data read from temporary block 214. Page buffers PB0 through PBn-1 output the detected fail bits. Fail bits indicator 250 of FIG. 12 obtains the total number of fail bits using the detected fail bits (S350).

Next, control logic 250 determines whether there is the worst fail bit sector during a current loop using the numbers of fail bits of the sectors delivered from fail bits indicator 240 (S360). The worst fail bit sector is a sector that has the largest number of fail bits among a plurality of sectors, and has a greater number of fail bits than any sector in a previous program loop. Where there is the worst fail bit sector, control logic 250 determines whether a fail bit value in the worst fail bit sector is error-correctible (S365). Where the fail bit value in the worst fail bit sector is error-correctible, the program operation is finished. On the other hand, where the fail bit value in the worst fail bit sector is not error-correctible, the program operation is deemed a failure.

Where there is no worst fail bit sector, the method determines whether the number of loops "i" is equal to a maximum value (S370). Where the number of loop "i" is the maximum value, the program operation is deemed a failure. Otherwise, where the number of loops "i" is not equal to the maximum value, the number of loops "i" is incremented by one (S380) and the method proceeds to step S320.

Figure 14:
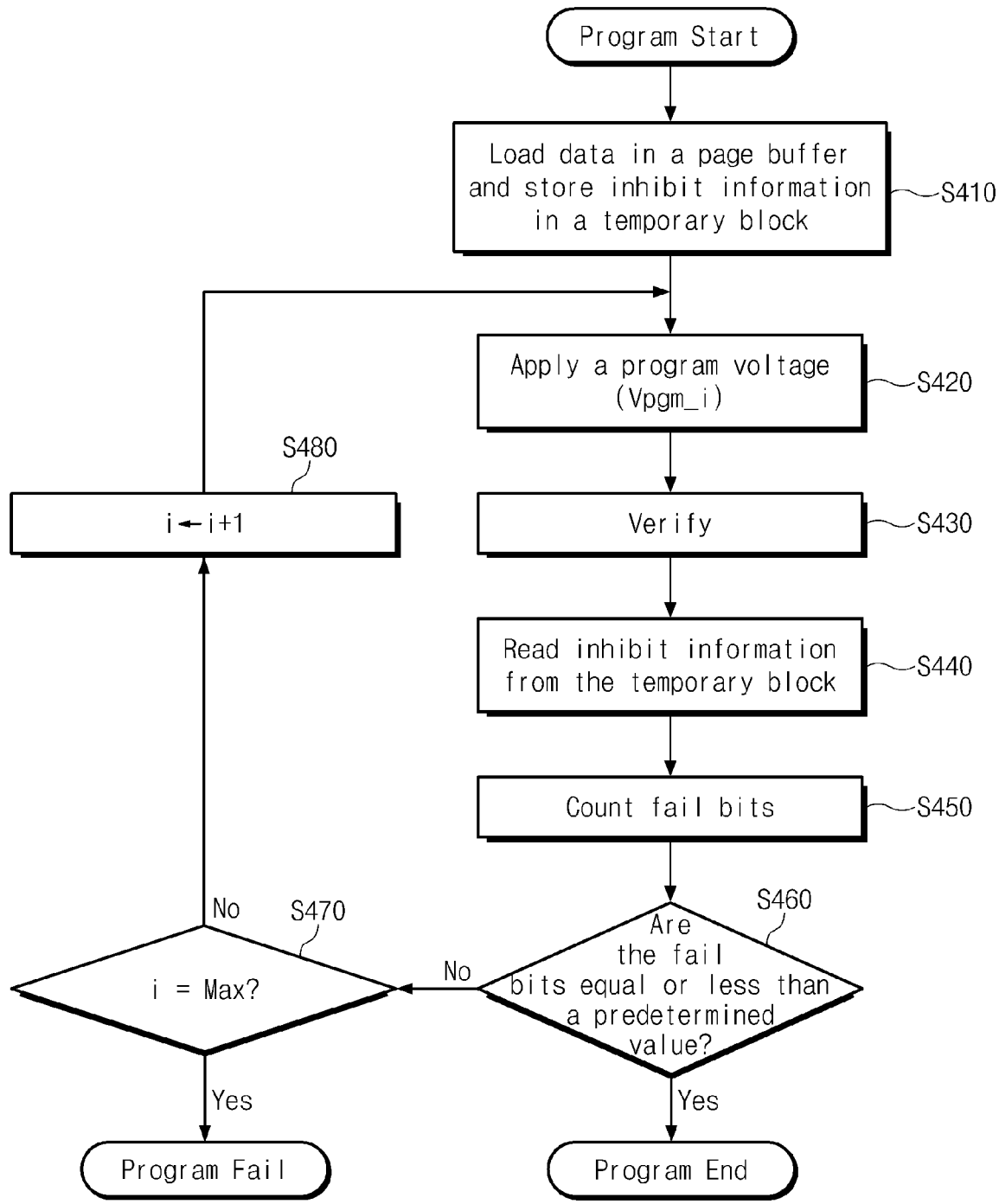
FIG. 14 is a flowchart illustrating a method of programming the nonvolatile memory device of FIG. 12 according to an embodiment of the inventive concept.

FIG. 14 is a flowchart illustrating a method of programming the nonvolatile memory device of FIG. 12 according to another embodiment of the inventive concept.

In the method of FIG. 14, a program operation begins by loading data to be programmed into page buffers PB0 through PBn-1 of input/output circuit 230 of FIG. 12 and loading inhibit bit information in temporary block 214 of FIG. 12 (S410). Control logic 250 of FIG. 12 generates bias voltages necessary for the program operation, and performs a program loop.

Control logic 250 sets voltages for bitlines BL0 through BLn-1 according to data stored in page buffers PB0 through PBn-1. A pass voltage is applied to non-selected wordlines, and a program voltage Vpgm_i is applied to a selected wordline (S420). The level of the program voltage Vpgm_1 is increased by a predetermined value as the number of loops "i" is increased. The pass voltage can be applied to the selected wordline for a predetermined time before program voltage Vpgm_i is applied. Next, a program recovery operation is performed. During the program recovery operation, the bias voltages applied to wordlines WL0 through WLm-1 and string selection line SSL are discharged, and voltages applied to bitlines BL0 through BLn1 are discharged.

Later, a program verify operation is performed to determine whether a program operation is properly performed (S430). The program verify operation determines data stored in selected memory cells using a verify read voltage or voltages.

Thereafter, inhibit information is read from temporary block 214 and stored in a data latch inside page buffers PB0 through PBn-1 of FIG. 12 (S440). Page buffers PB0 through PBn-1 detect fail bits using data read in the verify read operation and data read from temporary block 214. Page buffers PB0 through PBn-1 output the detected fail bits. The fail bits indicator 240 of FIG. 12 obtains the total number of fail bits based on the detected fail bits (S450). The number of fail bits is generally detected in sector units.

Subsequently, it is determined whether the number of fail bits of the sector with the most fail bits among a plurality of sectors in a current loop is greater than a predetermined number (S460). Where the number of fail bits of the sector with the most fail bits is equal to or less than the predetermined number, control logic 250 finishes the program operation. On the other hand, where the number of fail bits of the sector with the most fail bits is greater than the predetermined number, it is determined whether the number of loops "i" is equal to the maximum value (S470). Where the number of loops "i" is equal to the maximum value, a program operation is deemed a failure. On the other hand, where the number of loops "i" is not equal to the maximum value, the number of loops "i" is incremented by one and then a next loop is performed (S480).

The method of FIG. 14 can change a reference value for determining program completion based on programming conditions. The program conditions can comprise, for instance, a program/erase cycle count (P/E cycle count) and a program loop count of a program operation. For example, where a program operation is performed on a memory block having a low P/E cycle count, the reference value can be set with a low value, and where a program operation is performed on a memory block having a high P/E cycle count, the reference value can be set with a high value. The reference value is typically provided from a memory controller to control the nonvolatile memory device being programmed.

Figure 15:
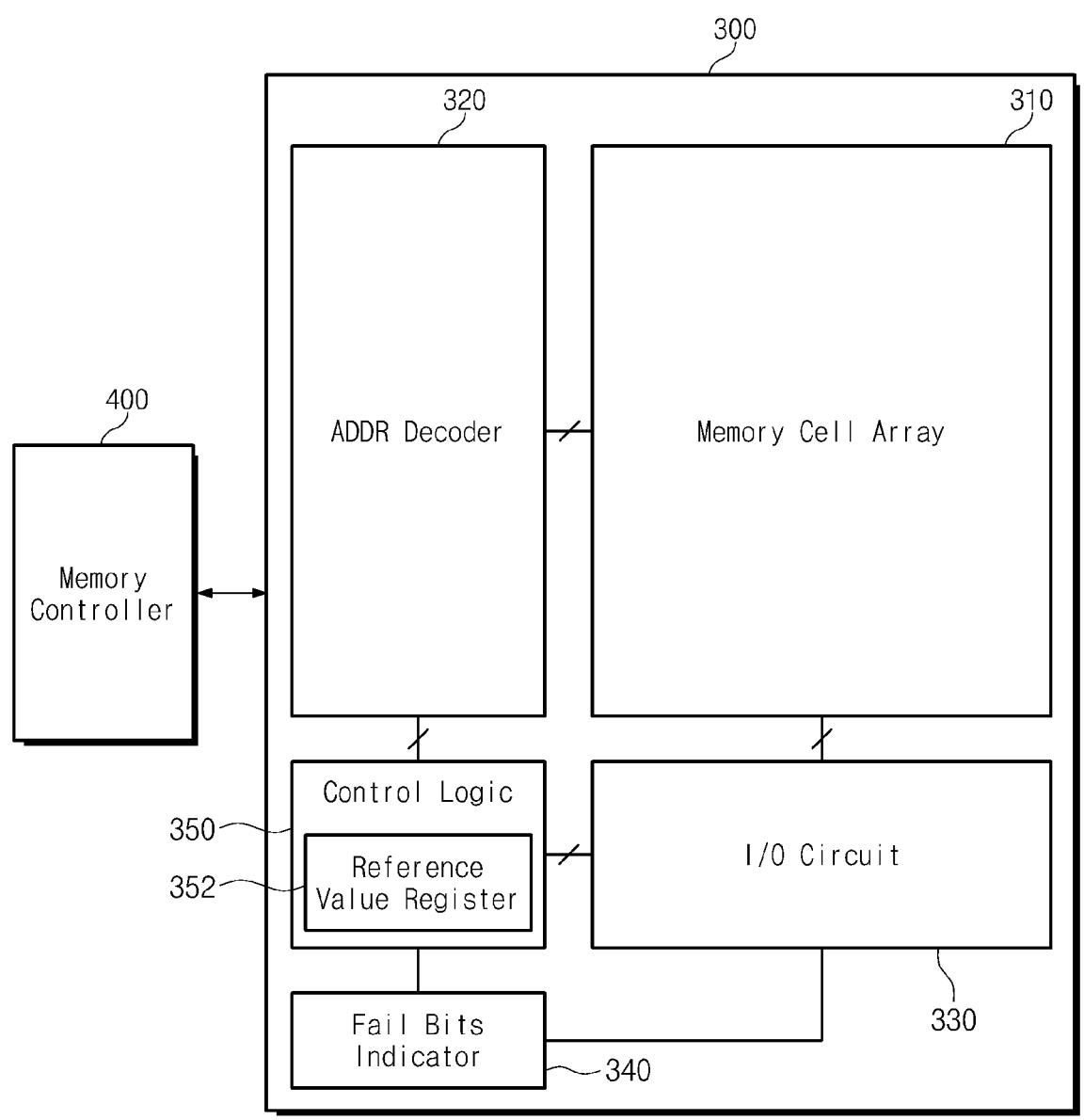
FIG. 15 is a block diagram of a nonvolatile memory device according to an embodiment of the inventive concept.

FIG. 15 is a block diagram of a nonvolatile memory device according to an embodiment of the inventive concept. Referring to FIG. 15, a flash memory 300 comprises a memory cell array 310, an address decoder 320, an input/output circuit 330, a fail bits indicator 340, and control logic 350.

Memory cell array 310 is configured identical to memory cell array 210 of FIG. 12. Address decoder 320 is configured identical to address decoder 220 of FIG. 12. Input/output circuit 330 is configured identical to input/output circuit 230 of FIG. 12. Fail bits indicator 340 is configured identical to fail bits indicator 240 of FIG. 12.

Control logic 350 controls operations of nonvolatile memory device 300, such as program, read, and erase operations. Control logic 350 controls address decoder 320 and input/output circuit 330 to perform a program operation using ISPP. Control logic 350 generates a program voltage with a voltage level that increases with successive loops of a program operation. The generated program voltage is provided to a selected wordline. Control logic 350 generates a pass voltage that is provided to the non-selected wordlines during the program operation.

Control logic 350 determines program completion according to the number of fail bits output from fail bits indicator 340 during the program operation. For example, where the total number of fail bits is less than or equal to a reference value, control logic 350 finishes the program operation. The reference value is stored in a reference value register 352. The reference value is typically less than or equal to a maximum number of bits that can be corrected through the use of an error correction code.

The reference value can be varied by a memory controller 400 based on programming conditions. For example, memory controller 400 can vary the reference value according to a P/E cycle count of a memory block where the program operation is performed and store the determined reference value in reference value register 352 of control logic 350.

Figure 16:
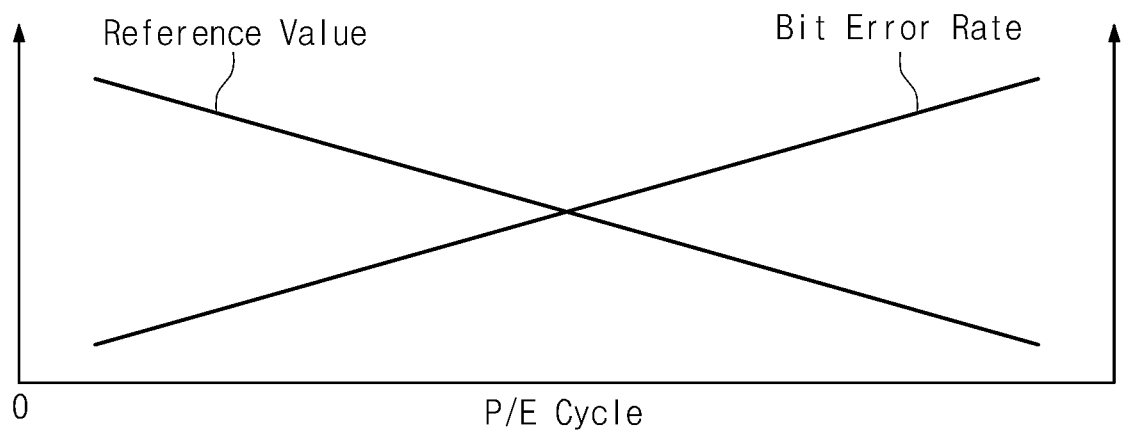
FIG. 16 is a diagram illustrating a change of a reference value according to a program/erase (P/E) cycle count in the nonvolatile memory device of FIG. 15.

FIG. 16 is a diagram illustrating a change of a reference value according to a P/E cycle count in the nonvolatile memory device of FIG. 15. Referring to FIG. 16, the reference value decreases gradually as the P/E cycle count is increased. By changing the reference value, the time required to perform a program operation can be improved in a memory block having a small P/E cycle count. Since the bit error rate tends to be relatively low in a memory block having a small P/E cycle count, the reference value can be increased. In addition, in certain embodiments, allowable values of erase and program fail bits can be separately controlled based on the P/E cycle count.

Figure 17:
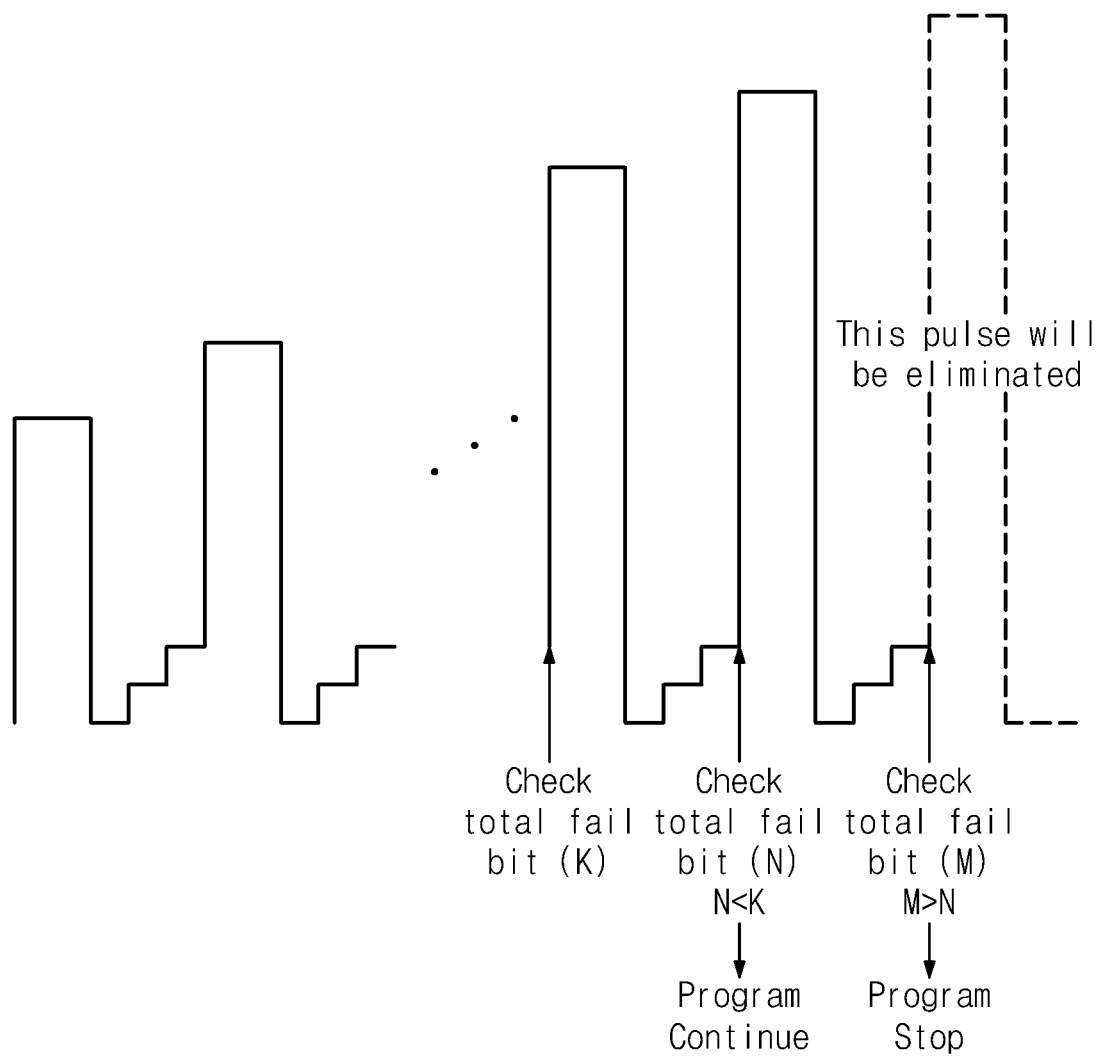
FIG. 17 is a voltage diagram illustrating a reduction in the number of program pulses used to program a nonvolatile memory device according to an embodiment of the inventive concept.

FIG. 17 is a voltage diagram illustrating a reduction in the number of program pulses used to program a nonvolatile memory device according to an embodiment of the inventive concept. During a program verify operation, it is determined whether a program operation continues to be performed or is completed based on a number of fail bits. As shown in FIG. 17, where the total number of fail bits "N" during a current program loop is less than the total number of fail bits K during a previous program loop, the program operation continues. Otherwise, where the total number of fail bits "M" during a current program loop is greater than the total number of fail bits "N" during a previous program loop, the program operation is completed. Accordingly, a next pulse is eliminated.

Figure 18:
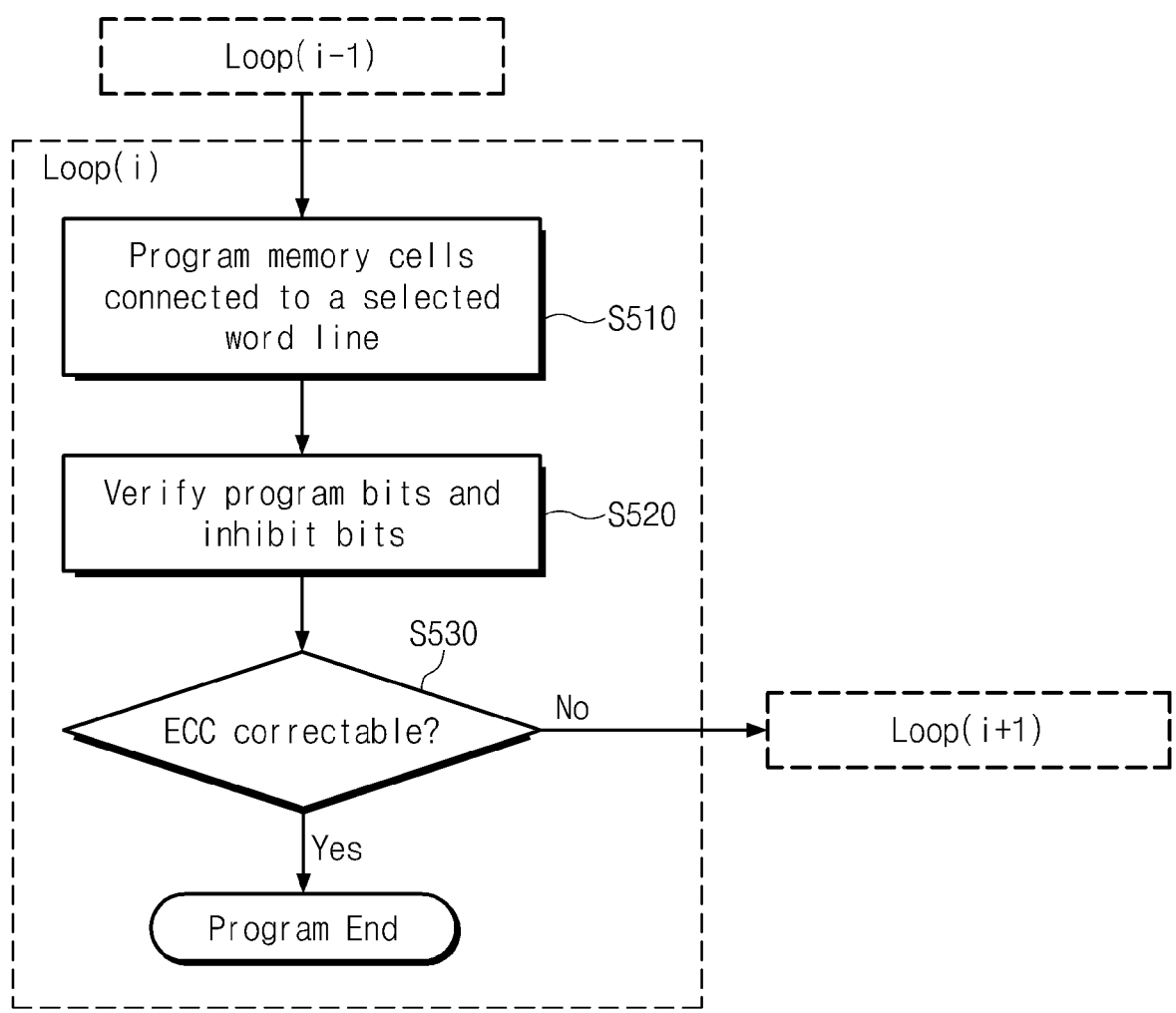
FIG. 18 is a flowchart illustrating a program loop of a nonvolatile memory device according to an embodiment of the inventive concept.

FIG. 18 is a flowchart illustrating a program loop of a nonvolatile memory device according to an embodiment of the inventive concept. As indicated by FIG. 18, where a program operation on memory cells connected to a selected wordline is not completed following a program loop i–1, another program loop "i" is performed on the memory cells (S510). Then, a program verify operation is performed on the memory cells to detect program bits and inhibit bits (S520). Where the number of fail bits detected by the program verify operation is correctible through the use of an error correction code, the program operation is terminated. Otherwise, a next loop i+1 is performed (S530). Next loop i+1 is performed similar to loop "i".

Figure 19:
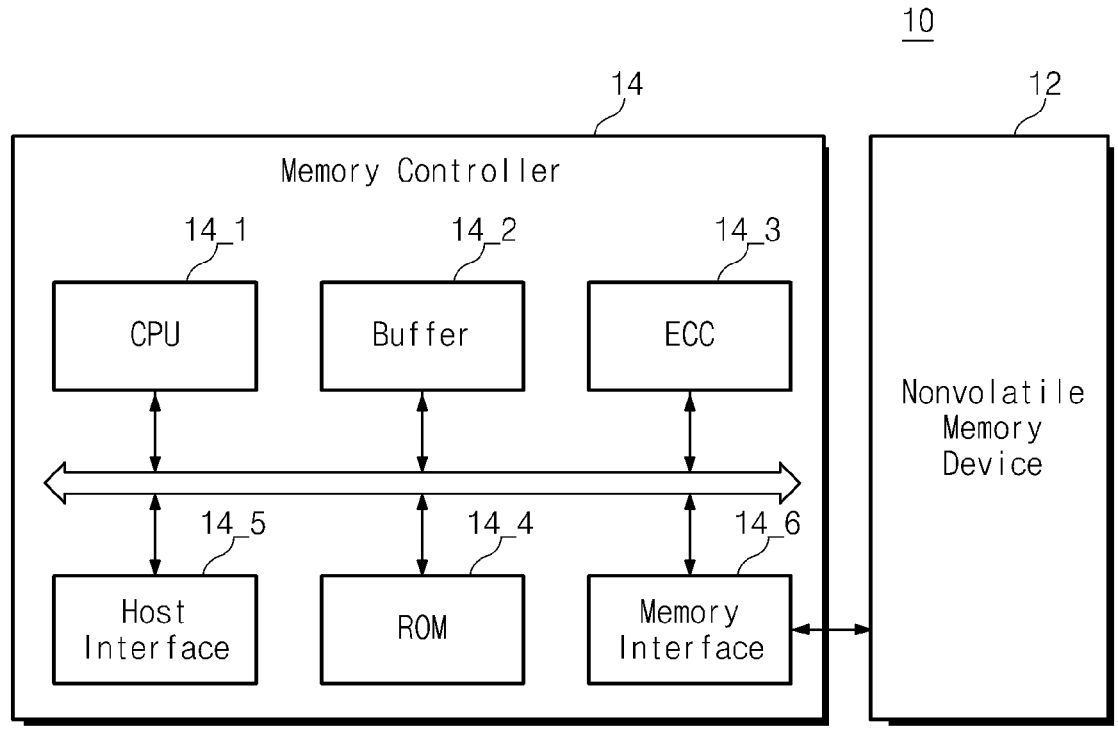
FIG. 19 is a block diagram of a nonvolatile memory device according to an embodiment of the inventive concept.

FIG. 19 is a block diagram of a nonvolatile memory device according to an embodiment of the inventive concept. Referring to FIG. 19, a memory system 10 comprises a nonvolatile memory device 12 and a memory controller 14.

Nonvolatile memory device 12 is typically configured similar to nonvolatile memory devices 100, 200, and 300 of FIGS. 3, 12, and 15.

Memory controller 14 controls nonvolatile memory device 12 in response to a request from an external source, such as a host. For example, memory controller 14 typically controls program, read, and erase operations of nonvolatile memory device 12.

Memory controller 14 provides an interface between nonvolatile memory device 14 and the host. In certain embodiments, memory controller 14 drives a firmware for controlling nonvolatile memory device 12.

Memory controller 14 comprises a central processing unit (CPU) 14_1, a buffer 14_2, an error correction code (ECC) circuit 14_3, a ROM 14_4, a host interface 14_5, and a memory interface 14_6.

CPU 14_1 controls general operations of memory controller 14.

Buffer 14_2 is used as an operating memory of CPU 14_1. In response to a program request from the host, data received from the host is temporarily stored in buffer 14_2. In addition, in response to a read request from the host, data read from nonvolatile memory device 12 is temporarily stored in buffer 14_2.

In a program operation, ECC circuit 14_3 decodes data stored in buffer 14_2 to generate an error correction code that can be used subsequently to decode errors in the data after it is stored in nonvolatile memory device 12. The decoded data and the error correction code are then stored in nonvolatile memory device 12. In a read operation, ECC circuit 14_3 restores data read from nonvolatile memory device 12 using the generated error correction code value.

ROM 14_4 stores data necessary for driving memory controller 14.

Host interface 14_5 implements a protocol for exchanging data between the host and memory controller 14. As examples, memory controller 14 can communicate with the host using a protocol such as universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol.

Memory interface 14_6 provides an interface between nonvolatile memory device 12 and memory controller 14.

Figure 20:
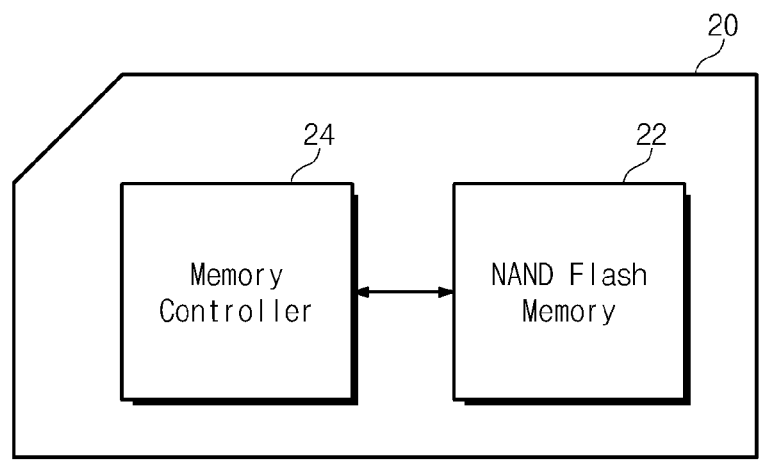
FIG. 20 is a block diagram of a nonvolatile memory device according to an embodiment of the inventive concept.

FIG. 20 is a block diagram of a nonvolatile memory device according to an embodiment of the inventive concept. Referring to FIG. 20, a memory card 20 comprises a NAND flash memory device 22 and a memory controller 24 for controlling NAND flash memory device 22.

NAND flash memory device 22 is configured similar to nonvolatile memory devices 100, 200, and 300 of FIGS. 3, 12, and 15. NAND flash memory device 22 finishes a program operation based on the total number of fail bits identified in a program verify operation.

Memory controller 24 is connected to the host and NAND flash memory device 22. Memory controller 24 is configured to access NAND flash memory device 22 in response to a request from the host.

Memory controller 24 is typically configured to drive firmware for controlling NAND flash memory device 22. Memory controller 22 typically comprises features such as a RAM, a processing unit, a host interface, and a NAND flash interface. The host interface interfaces with a host through a card (e.g., a Multi Media Card (MMC)) protocol to perform data exchange between the host and memory controller 24.

In various alternative embodiments, memory card 20 can be implemented, for instance, as a multimedia card, a secure digital (SD) card, a miniSD card, a memory stick, a smartmedia card, or a TransFlash card.

Figure 21:
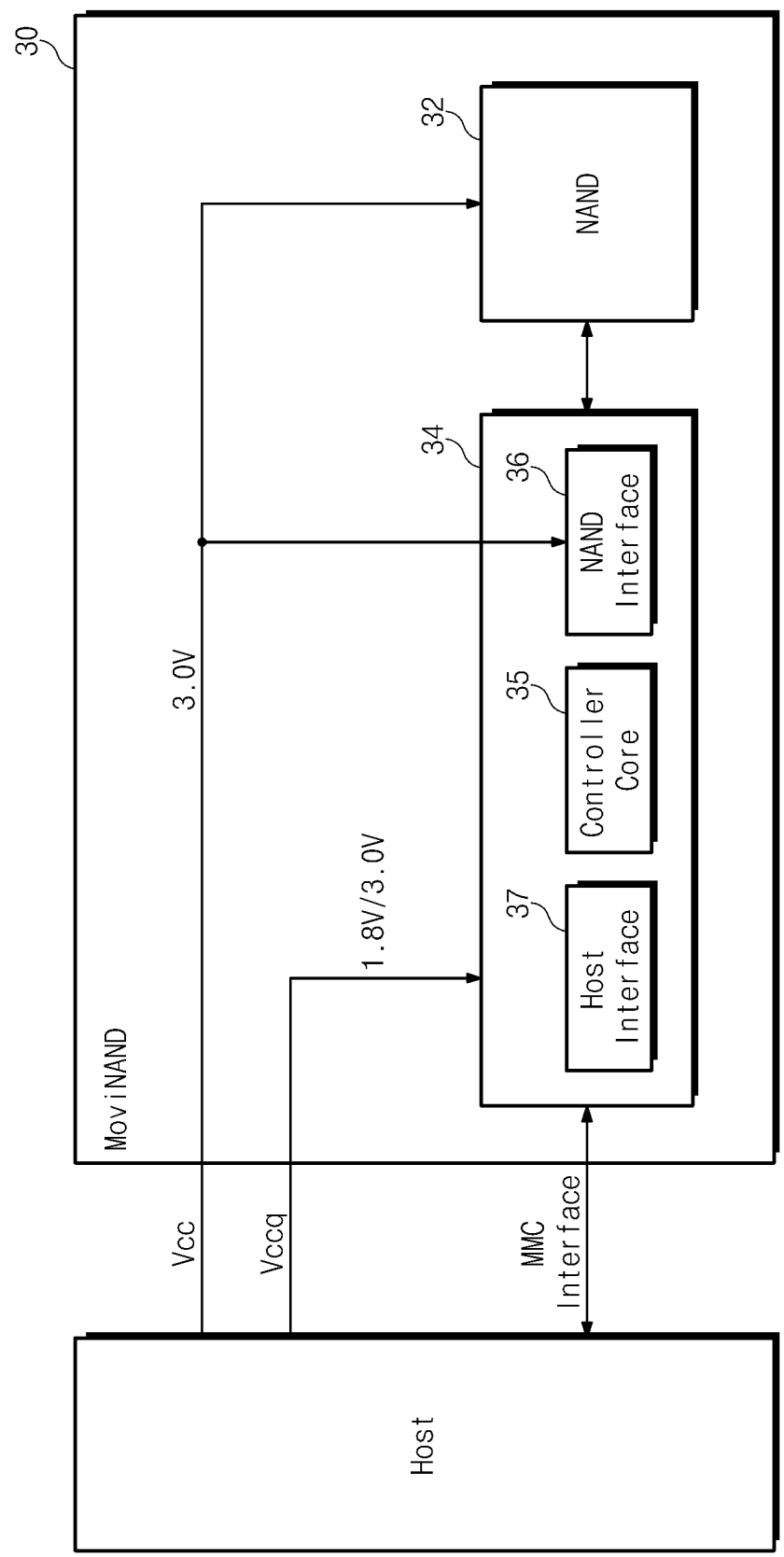
FIG. 21 is a block diagram of a MoviNAND device comprising a nonvolatile memory device according to an embodiment of the inventive concept.

FIG. 21 is a block diagram of a MoviNAND device comprising a nonvolatile memory device according to an embodiment of the inventive concept. Referring to FIG. 21, MoviNAND 30 comprises a NAND flash memory device 32 and a memory controller 34.

NAND flash memory device 32 is formed by stacking single NAND flash memory devices in one package, such as a fine-pitch ball grid array (FBGA). Each single NAND flash memory is typically configured identical to one of nonvolatile memory device 100, 200, and 300 of FIGS. 3, 12, and 15. NAND flash memory device 32 completes a program operation based on the total number of fail bits identified in a verify read operation.

NAND flash memory device 32 typically comprises a multi level cell or a single level cell flash memory device.

Controller 34 comprises a controller core 35, a NAND interface 36, and a host interface 37. Controller core 34 controls general operations of MoviNAND 30. NAND interface 36 provides an interface between NAND flash memory device 32 and controller 34. Host interface 37 forms an interface between controller 34 and an MMC of a host.

MoviNAND 30 receives power voltages Vcc and Vccq from a host. Power voltage Vcc of 3V is applied to NAND flash memory device 32 and NAND interface 26, and power voltage Vccq of 1.8 V/3V is applied to controller 34.

Figure 22:
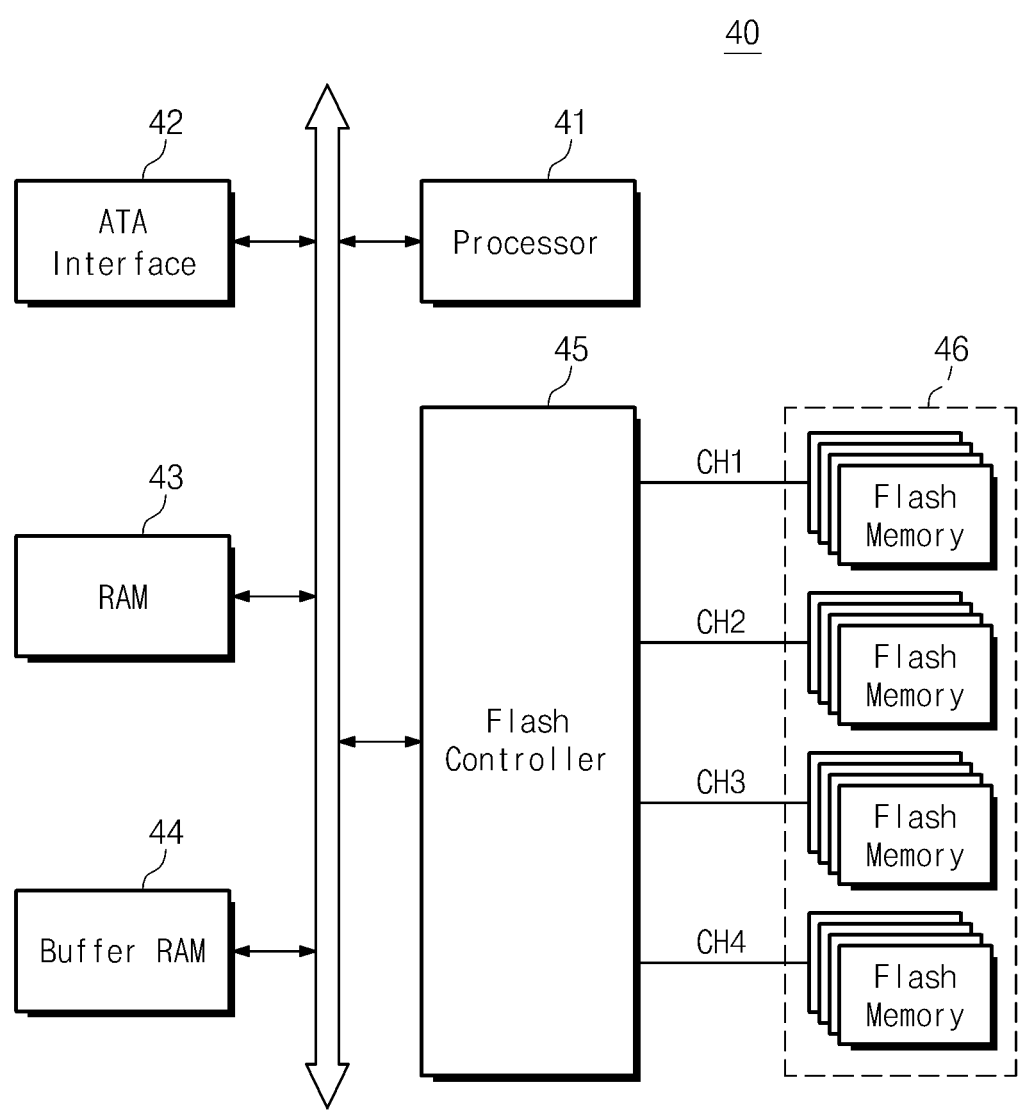
FIG. 22 is a block diagram of an SSD according to an embodiment of the inventive concept.

FIG. 22 is a block diagram of an SSD according to an embodiment of the inventive concept. Referring to FIG. 22, SSD 40 comprises a processor 41, an ATA interface 42, a RAM 43, a cache buffer RAM 44, a flash controller 45, and a plurality of flash memory devices 46. Each flash memory device is configured similar to nonvolatile memory devices 100, 200, and 300 of FIGS. 3, 12, and 15. Nonvolatile memory device 46 finishes a program operation according to a total number of fail bits identified in a program verify operation.

ATA interface 42 exchanges data with the external according to a control of processor 41. ATA interface 42 fetches a command and an address from a host and delivers the command and address to processor 41 via a CPU bus. ATA interface 42 can comprise, for instance, a serial advanced technology attachment (SATA) interface, a parallel advanced technology attachment (PATA) interface, or an external SATA (ESATA) interface.

Data to be input to ATA interface 42 and data output by ATA interface 42 is delivered to cache buffer RAM 44 without passing through the CPU bus under the control of processor 41.

RAM 43 is used to temporarily store data necessary for the operation of SSD 40. RAM 43 is a volatile memory device may include DRAM or SRAM.

Cache buffer RAM 44 temporarily stores transmission data between a host and flash memory devices 46. Additionally, cache buffer RAM 44 is used to store a program operated by processor 41. Cache buffer RAM 44 can act as a buffer memory and be implemented by an SRAM.

Memory controller 45 exchanges data with flash memory devices 46 used for mass data storage. Flash controller 45 is configured to support a NAND flash memory, a One-NAND flash memory, a multi level flash memory, and a single level flash memory.

In addition, processor 41 and flash controller 45 may be implemented with a shared RAM.

Figure 23:
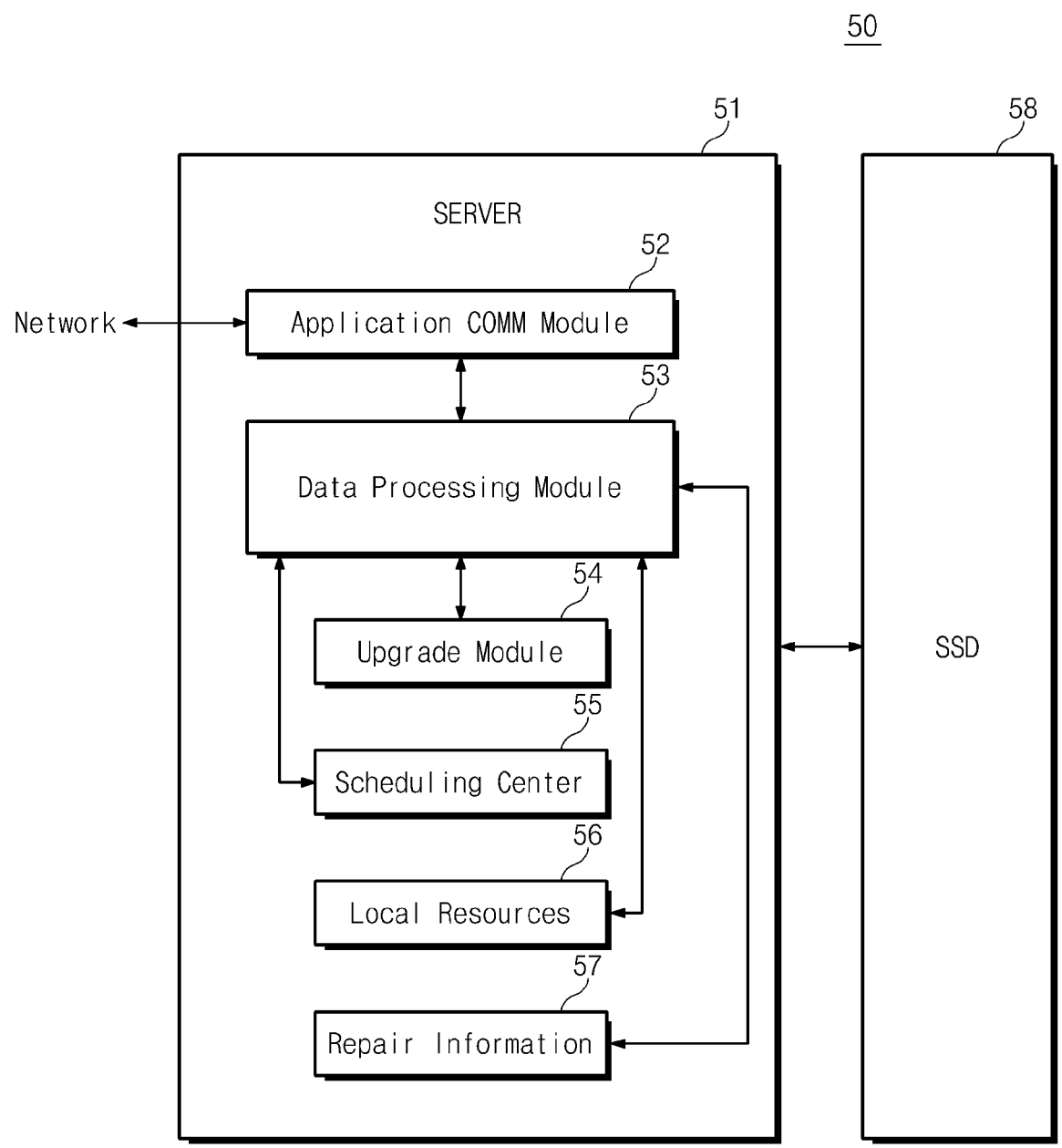
FIG. 23 is a block diagram illustrating a server system comprising an SSD according to an embodiment of the inventive concept.

FIG. 23 is a block diagram illustrating a server system using an SSD according to an embodiment of the inventive concept. Referring to FIG. 23, server system 50 comprises a server 51 and an SSD 58 for storing data necessary to operate server 51. SSD 58 is generally configured similar to SSD 40 of FIG. 22.

Server 51 comprises application communication module 52, a data processing module 53, an upgrade module 54, a scheduling center 55, a local resource module 56, and a repair information module 57.

Application communication module 52 facilitates communication between server 51 and a computing system connected to a network, and between server 51 and SSD 58. Application communication module 52 transmits data or information provided through the user interface to data processing module 53.

Data processing module 53 is linked to local resource module 56. Local resource module 56 provides a list of repair ships/dealers/technical information to a user based on data or information input to server 51.

Upgrade module 54 interfaces with data processing module 53. Upgrade module 54 upgrades firmware, reset code, diagnosis system upgrades, and other information based on data transmitted from SSD 58.

Scheduling center 55 provides a real time option to a user based on data or information input to server 51.

Repair information module 57 interfaces with data processing module 53. Repair information module 57 is used to provide repair related information, such as audio, video, or text files, to a user. Data processing module 53 packages information based on information delivered from SSD 58. Later, this information is transmitted to SSD 58 or displayed to a user.

Figure 24:
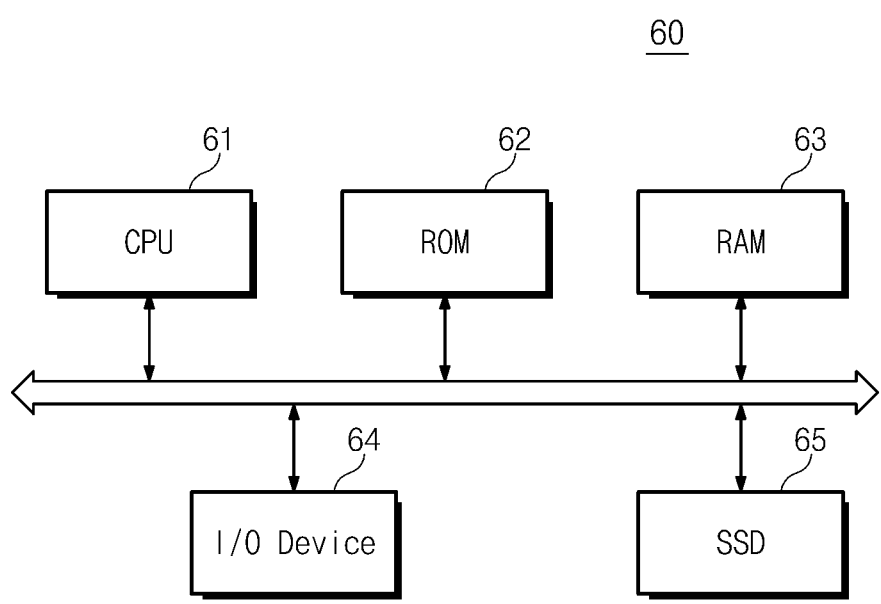
FIG. 24 is a block diagram of a computing system according to an embodiment of the inventive concept.

FIG. 24 is a block diagram of a computing system according to an embodiment of the inventive concept. Referring to FIG. 24, computing system 60 comprises a central processing unit (CPU) 61, a ROM 62, a RAM 63, an input/output device 64, and an SSD 65.

CPU 51 is connected to a system bus. ROM 62 stores data used to drive computing system 50. The data typically comprises a start command sequence, and a basic input/output operation system sequence. RAM 63 is used to temporarily store data used during the operation of CPU 61.

Input/output device 64 is typically connected to the system bus through an input/output device interface such as a keyboard, a pointing device (e.g., a mouse), a monitor, and a modem.

SSD 65 is a readable and writable storage device and is typically similar to SSD 40 of FIG. 22.

Figure 25:
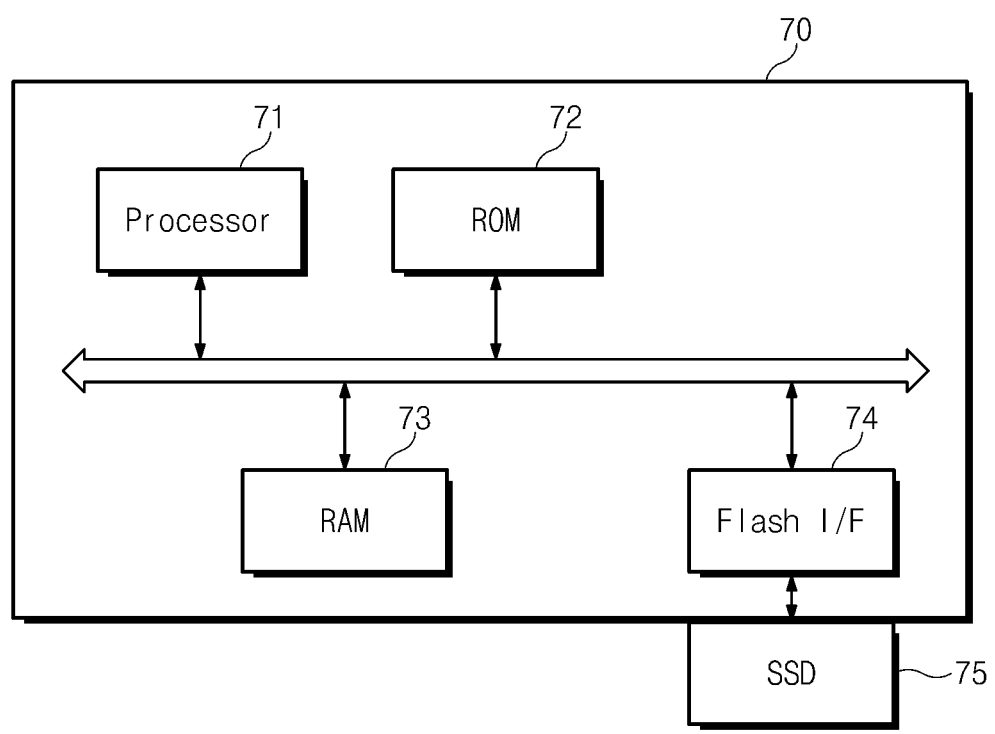
FIG. 25 is a block diagram of an electronic device according to an embodiment of the inventive concept.

FIG. 25 is a block diagram of an electronic device according to an embodiment of the inventive concept. Referring to FIG. 25, electric device 70 comprises a processor 71, a ROM 72, a RAM 73, a flash interface 74, and an SSD 75.

Processor 71 accesses RAM 73 to execute firmware or other code. Additionally, processor 71 accesses ROM 72 to execute fixed command sequences such as a start command sequence or a basic input/output operation system sequence. Flash interface 74 provides an interface between electronic device 70 and SSD 75.

SSD 75 is detachable from electronic device 70. SSD 75 is typically implemented similar to SSD 40 of FIG. 22.

Electronic device 70 can comprise, for instance, a cellular phone, a personal digital assistant (PDA), a digital camera, a camcorder, a portable audio playing device (e.g., an MP3 player), or a PMP.

The memory systems and storage devices described above can be mounted in various forms of packages. For example, the memory systems and storage devices can be mounted in package configurations such as package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of performing a program operation in a nonvolatile memory device, comprising:
    (a) applying a program pulse to selected memory cells;
    (b) detecting a number of fail bits among the selected memory cells, the fail bits comprising failed program bits and disturbed inhibit bits; and
    (c) determining a program completion status of the program operation based on the number of detected fail bits, wherein the disturbed inhibit bits include at least one disturbed inhibit bit among erase bits or at least one disturbed inhibit bit among passed program bits.

2. The method of claim 1, wherein (b) comprises detecting the number of failed program bits and disturbed program bits simultaneously.

3. The method of claim 1, further comprising:
    repeating (a), (b), and (c) until the detected number of failed bits falls below a predetermined reference value.

4. The method of claim 1, further comprising:
    performing a plurality of program loops each comprising (a), (b), and (c) until a detected number of fail bits in a current program loop increases relative to a detected number of fail bits in a previous program loop.

5. The method of claim 1, wherein the program operation is completed upon determining that the number of detected fail bits is less than or equal to a reference value.

6. The method of claim 5, wherein the reference value changes according to a number of program or erase operations that have been performed previously on a memory block containing the selected memory cells.

7. The method of claim 6, wherein the reference value decreases as the number of program or erase operations increases.

8. The method of claim 5, wherein the reference value corresponds to a number of bits that can be corrected through the use of an error correction code.

9. The method of claim 1, further comprising:
    performing a plurality of program loops each comprising (a), (b), and (c), and designating the program operation as a failure upon determining that a predetermined number of program loops have been performed and the number of fail bits remains above another predetermined value.

10. The method of claim 1, wherein the nonvolatile memory device is a flash memory device.

11. The method of claim 10, wherein the nonvolatile memory device is a multi-level cell flash memory device.

12. The method of claim 1, wherein (b) further comprises detecting fail bits in each of a plurality of sectors of the selected memory cells, and (c) further comprises determining the program completion status based on a number of fail bits in each of the sectors.

13. A nonvolatile memory device comprising:
a page buffer circuit configured to store program bits and inhibit bits to be programmed in selected memory cells in a program operation, and further configured to perform a program verify operation to detect failed program bits and disturbed inhibit bits from the selected memory cells; and
a control logic configured to determine a completion state of the program operation based on the number of detected failed program bits and disturbed inhibit bits,
wherein the disturbed inhibit bits include at least one disturbed inhibit bit among erase bits or at least one disturbed inhibit bit among passed program bits.

14. The nonvolatile memory device of claim 13, wherein the page buffer circuit comprises a plurality of page buffers, and each of the plurality of page buffers comprises an inhibit data latch for storing inhibit bit data, and a sense latch for storing data indicating a program state of a corresponding one of the selected memory cells,
wherein each of the plurality of page buffers is configured to compare the stored inhibit bit data with the data stored in the sense latch to determine a program status of the corresponding one of the selected memory cells.

15. The nonvolatile memory device of claim 14, wherein the sense latch is configured to store a fail bit to indicate whether the corresponding one of the selected memory cells has been successfully programmed, and to output a fail bit upon determining that the corresponding one of the selected memory cells has not been successfully programmed; and
wherein each of the plurality of page buffers outputs the fail bit stored in its sense latch in response to a program verify signal during the program verify operation.

16. The method of claim 15, wherein the selected memory cells are flash memory cells.

17. A memory system comprising:
a nonvolatile memory device; and
a memory controller controlling the nonvolatile memory device to perform a program operation comprising applying a program pulse to selected memory cells, detecting a number of failed program bits and disturbed inhibit bits, and determining a program completion status of the program operation based on the detected number of failed program bits and disturbed inhibit bits,
wherein the disturbed inhibit bits include at least one disturbed inhibit bit among erase bits or at least one disturbed inhibit bit among passed program bits.

18. The memory system of claim 17, wherein the nonvolatile memory device and the memory controller are incorporated in a solid state drive.

19. The memory system of claim 17, wherein the memory controller controls the nonvolatile memory device to terminate the program operation upon determining that the detected number of failed program bits and disturbed inhibit bits exceeds a predetermined reference number.

20. The memory system of claim 17, further comprising:
an error correction code circuit configured to correct the failed program bits and disturbed inhibit bits in a read operation performed subsequent to the program operation.

\* \* \* \* \*